(12) United States Patent
Liaw

(10) Patent No.: US 11,764,287 B2
(45) Date of Patent: Sep. 19, 2023

(54) MULTI-GATE TRANSISTOR STRUCTURE

(71) Applicant: Taiwan Semiconductor Manufacturing Co., Ltd., Hsin-Chu (TW)

(72) Inventor: Jhon Jhy Liaw, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/542,979

(22) Filed: Dec. 6, 2021

(65) Prior Publication Data

US 2022/0093767 A1 Mar. 24, 2022

Related U.S. Application Data

(63) Continuation of application No. 16/937,218, filed on Jul. 23, 2020, now Pat. No. 11,195,937.
(Continued)

(51) Int. Cl.
*H01L 29/66* (2006.01)
*H01L 21/8234* (2006.01)
(Continued)

(52) U.S. Cl.
CPC .. *H01L 29/6656* (2013.01); *H01L 21/823431* (2013.01); *H01L 29/0653* (2013.01);
(Continued)

(58) Field of Classification Search
CPC ........... H01L 29/66553; H01L 29/6656; H01L 29/78696; H01L 29/42392; H01L 2029/7858
See application file for complete search history.

(56) References Cited

U.S. PATENT DOCUMENTS 8,963,258 B2 2/2015 Yu et al.
9,818,872 B2 11/2017 Ching et al.
(Continued)

FOREIGN PATENT DOCUMENTS

KR 20180113118 10/2018
KR 20190024580 A 3/2019
(Continued)

*Primary Examiner* — Changhyun Yi
(74) *Attorney, Agent, or Firm* — HAYNES AND BOONE, LLP

(57) ABSTRACT

A semiconductor device according to the present disclosure includes a first channel member including a first channel portion and a first connection portion, a second channel member including a second channel portion and a second connection portion, a gate structure disposed around the first channel portion and the second channel portion, and an inner spacer feature disposed between the first connection portion and the second connection portion. The gate structure includes a gate dielectric layer and a gate electrode. The gate dielectric layer extends partially between the inner spacer feature and the first connection portion and between the inner spacer feature and the second connection portion. The gate electrode does not extend between the inner spacer feature and the first connection portion and between the inner spacer feature and the second connection portion.

20 Claims, 26 Drawing Sheets

Related U.S. Application Data

(60) Provisional application No. 63/002,529, filed on Mar. 31, 2020.

(51) Int. Cl.
  *H01L 29/06* (2006.01)
  *H01L 29/10* (2006.01)
  *H01L 29/423* (2006.01)
  *H01L 29/78* (2006.01)

(52) U.S. Cl.
  CPC .... *H01L 29/1033* (2013.01); *H01L 29/42392* (2013.01); *H01L 29/66553* (2013.01); *H01L 29/785* (2013.01); *H01L 2029/7858* (2013.01)

(56) References Cited

U.S. PATENT DOCUMENTS

| | | | |
|---|---|---|---|
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 10,553,696 B2 * | 2/2020 | Ando | H01L 29/78696 |
| 10,629,740 B2 * | 4/2020 | Yang | H01L 29/775 |
| 11,195,937 B2 * | 12/2021 | Liaw | H01L 29/78696 |
| 2018/0175036 A1 | 6/2018 | Ching et al. | |
| 2019/0148515 A1 | 5/2019 | Cheng et al. | |
| 2019/0157414 A1 | 5/2019 | Ando et al. | |
| 2019/0157444 A1 | 5/2019 | Yang et al. | |
| 2019/0181224 A1 * | 6/2019 | Zhang | H01L 29/66553 |
| 2019/0181257 A1 | 6/2019 | Jeong et al. | |
| 2020/0373402 A1 * | 11/2020 | Yang | H01L 21/823878 |
| 2021/0217848 A1 * | 7/2021 | Kim | H01L 29/42392 |

FOREIGN PATENT DOCUMENTS

| | | |
|---|---|---|
| TW | 201803028 A | 1/2018 |
| TW | 201836067 A | 10/2018 |
| TW | 201911584 A | 3/2019 |
| TW | 201917898 A | 5/2019 |
| TW | 202006804 A | 2/2020 |

* cited by examiner

MULTI-GATE TRANSISTOR STRUCTURE

PRIORITY DATA

This application is a continuation application of U.S. patent application Ser. No. 16/937,218, filed Jul. 23, 2020, which claims priority to U.S. Provisional Patent Application No. 63/002,529, filed Mar. 31, 2020, entitled "MULTI-GATE TRANSISTOR STRUCTURE", each of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Inner spacer features have been implemented in MBC transistors to space a gate structure away from an epitaxial source/drain feature. However, some conventional inner spacer features may not provide sufficient spacing between the gate structure and the epitaxial source/drain feature, resulting in leaks or increased parasitic capacitance. Therefore, while conventional multi-gate structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
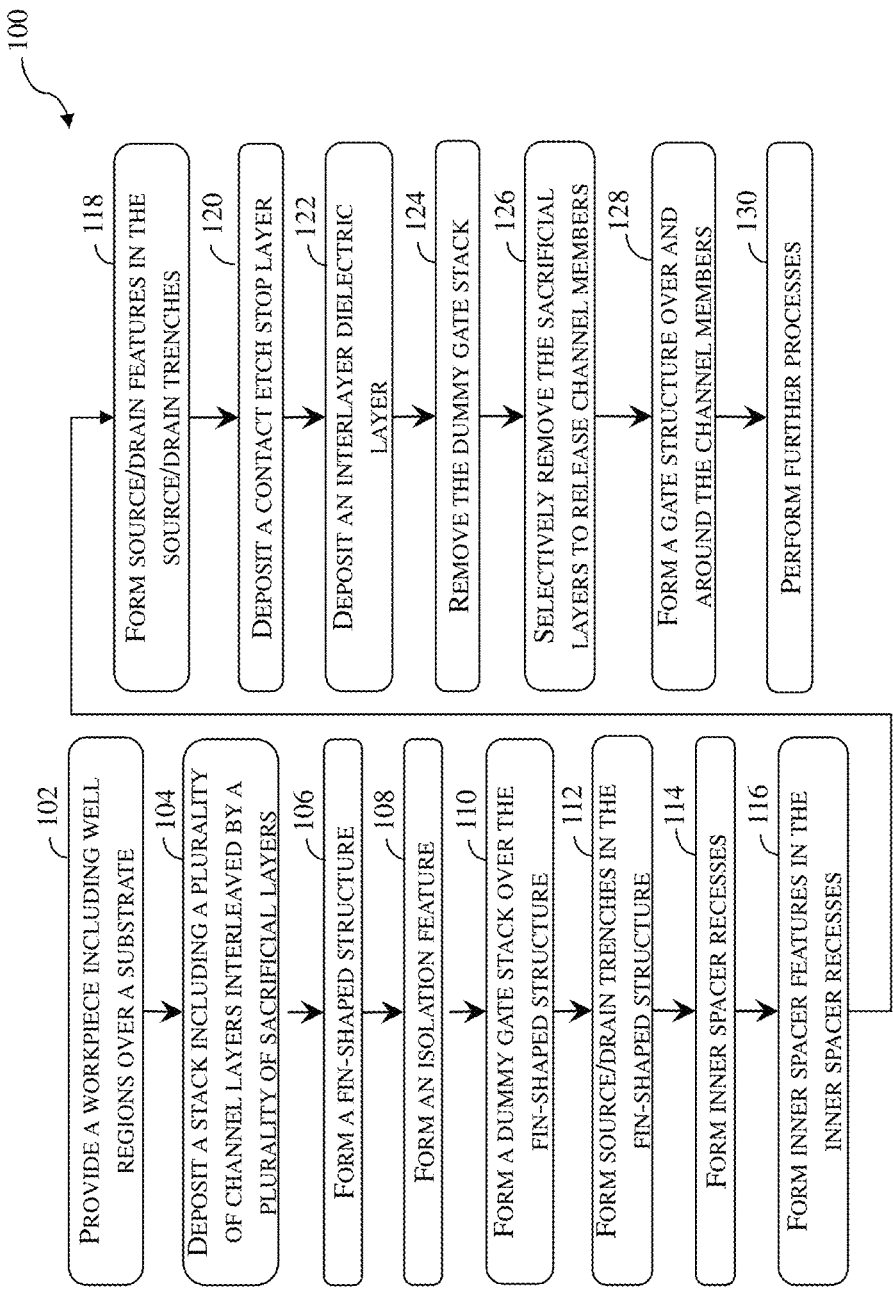
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to inner spacer features of an MBC transistor.

As described above, MBC transistors may also be referred to as SGTs, GAA transistors, nanosheet transistors, or nanowire transistors. They can be either n-type or p-type. MBC devices according to the present disclosure may have channel regions disposed in nanowire channel members, bar-shaped channel members, nanosheet channel members, nanostructure channel members, bridge-shaped channel members, and/or other suitable channel configurations. Inner spacer features have been implemented between channel members to isolate a gate structure from a source/drain feature. Convention spacer features may not provide sufficient separation between the gate structure and the source/drain feature. In addition, a distance between the gate structure and the source/drain feature may be reduced at the interface of the inner spacer feature and the channel members. As a result, conventional MBC transistors may have leaks or increased parasitic capacitance between the gate structure and the source/drain feature.

The present disclosure provides embodiments of a semiconductor device. The semiconductor device includes a plurality of channel members extending between two source/drain features. Each of the channel members is divided into a channel portion wrapped around by a gate structure and a connection portion sandwiched either between a gate spacer layer and an inner spacer feature or between two inner spacer features. An inner spacer feature according to the present disclosure may have a convex shape or a C shape such that a gate dielectric layer of the gate structure extends partially between a channel member and an inner spacer feature. In embodiments of the present disclosure, the gate electrode does not intrude between a connection portion and an inner spacer feature. The channel portion and the connection portion may have substantially the same thickness along their lengths. In some embodiments, a gate electrode of the gate structure may have a topmost portion over a topmost channel member and an inter-member portion between two adjacent channel members. A width of the topmost portion may be equal to or greater than a width of the inter-member portion. The structural arrangements of the present disclosure may reduce leakage and parasitic capacitance between the gate structure and the source/drain features.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with fragmentary cross-sectional views of the workpiece at different stages of fabrication according to embodiments of method 100.

Figure 2:
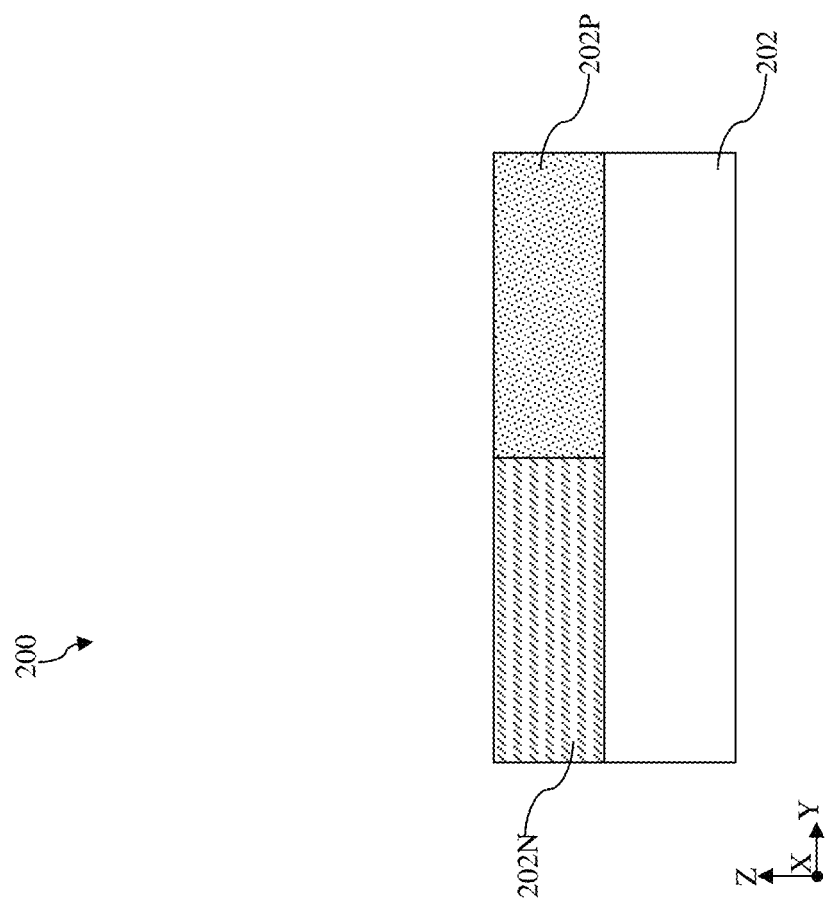
FIGS. 2-24 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is provided. It is noted that because the workpiece 200 will be fabricated into a semiconductor device, the workpiece 200 may also be referred to as the semiconductor device 200 as the context requires. The workpiece 200 may include a substrate 202 and a plurality of well regions on the substrate 202. In some embodiments illustrated in FIG. 2, the workpiece 200 includes an n-type well region 202N (or n-well 202N) and a p-type well region 202P (or p-well 202P) for fabrication of transistors of different conductivity types. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. Each of the n-well 202N and the p-well 202P is formed from the substrate 202 and includes a doping profile. The n-well 202N includes a doping profile of an n-type dopant, such as phosphorus (P) or arsenic (As). The p-well 202P includes a doping profile of a p-type dopant, such as boron (B). The doping the n-well 202N and the p-well 202P may be formed using ion implantation or thermal diffusion and may be consider portions of the substrate 202. For avoidance of doubts, the X direction, the Y direction and the Z direction are perpendicular to one another.

Figure 3:
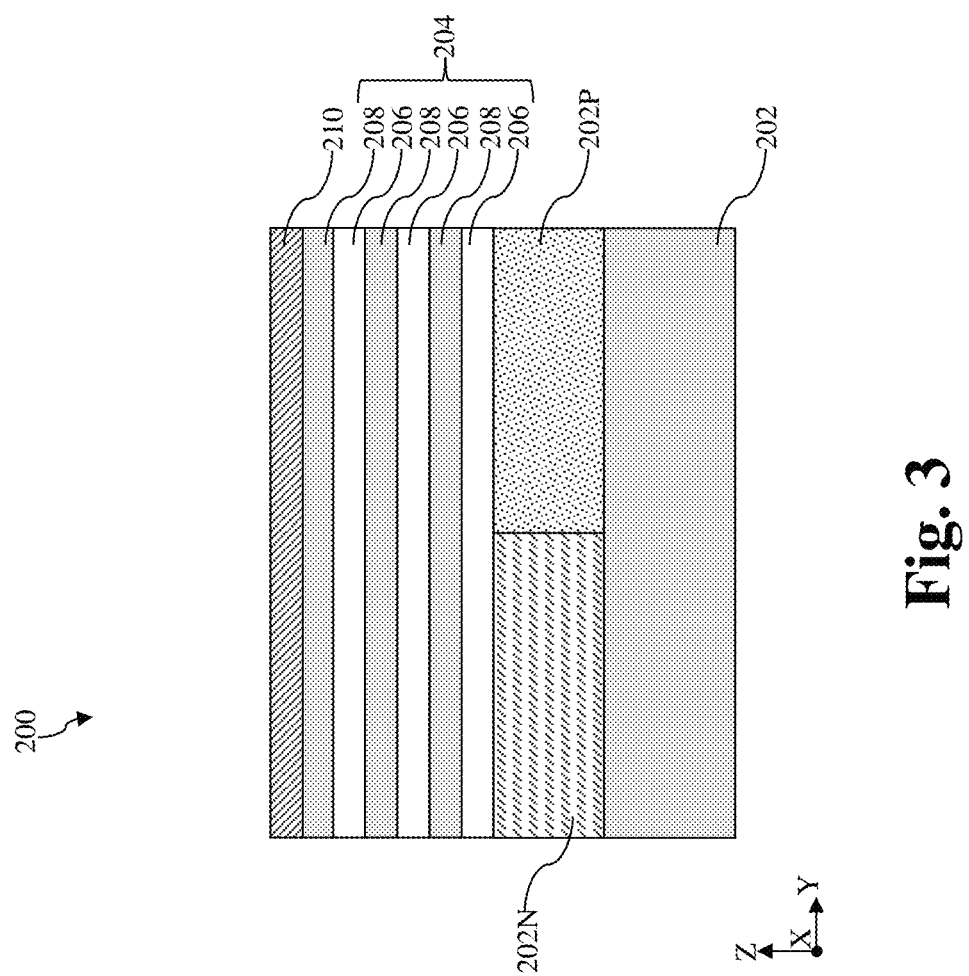

Referring to FIGS. 1 and 3, method 100 includes a block 104 where a stack 204 is deposited on the workpiece 200. As shown in FIG. 3, the stack 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon and sacrificial layers 206 are formed of silicon germanium. In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. Suitable epitaxial processes for block 104 include CVD deposition techniques (e.g., vapor-phase epitaxy (VPE) and/or ultra-high vacuum CVD (UHV-CVD)), molecular beam epitaxy (MBE), and/or other suitable processes. As shown in FIG. 3, at block 104, the sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged as illustrated in FIG. 3, which are for illustrative purposes only and not intended to be limiting beyond what is specifically recited in the claims. It can be appreciated that any number of sacrificial layers and channel layers can be formed in the stack 204. The number of layers depends on the desired number of channels members for the device 200. In some embodiments, the number of the channel layers 208 is between 2 and 10. For patterning purposes, a hard mask layer 210 may be deposited over the stack 204. The hard mask layer 210 may be a single layer or a multilayer. In one example, the hard mask layer 210 includes a silicon oxide layer and a silicon nitride layer. As shown in FIG. 3, the stack 204 is deposited over both the n-well 202N and the p-well 202P. In some instances, each of the sacrificial layers 206 may have a thickness (along the Z direction) between about 6 nm and about 15 nm and each of the channel layers 208 may have a thickness (along the Z direction) between about 4 nm and about 8 nm. Considering the thicknesses of the channel layers 208 and sacrificial layers 206, the channel layers 208 may be disposed at a pitch between about 10 nm and about 23 nm.

Figure 4:
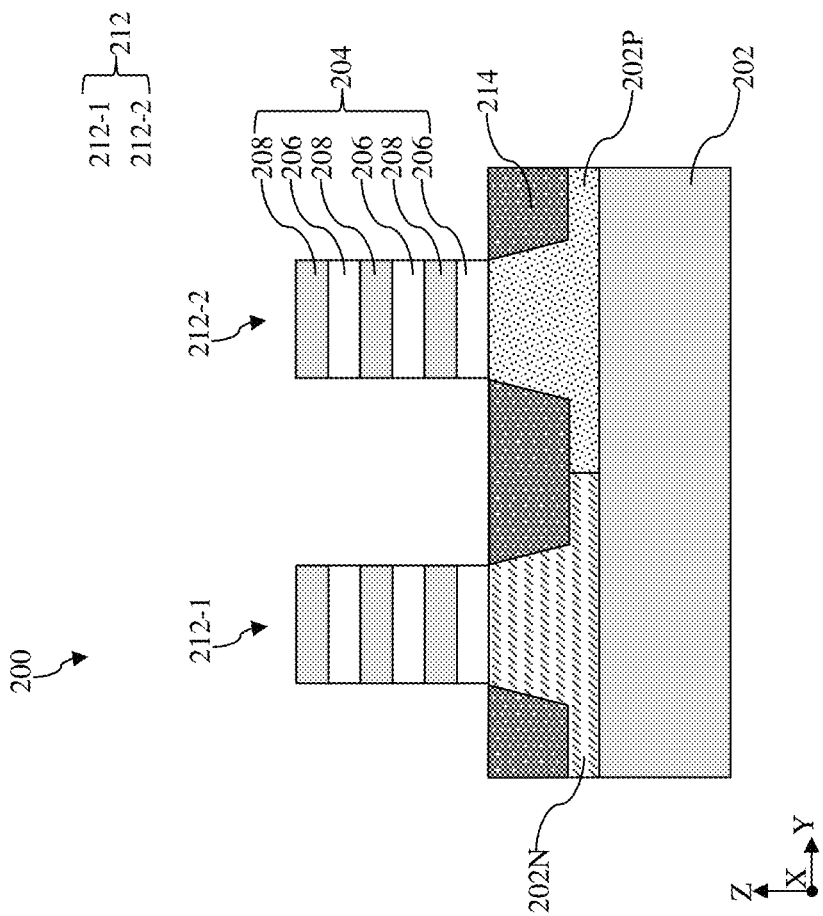

Referring to FIGS. 1 and 4, method 100 includes a block 106 where a plurality of fin-shaped structures 212 are formed from the stack 204. In FIG. 4, the plurality of fin-shaped structures 212 at least include a first fin-shaped structure 212-1 over the n-well 202N and a second fin-shaped structure 212-2 over the p-well 202P. In some embodiments, the stack 204 and the substrate 202 (including the n-well 202N and the P-well 202P) are patterned to form the fin-shaped structures 212. As shown in FIG. 4, the fin-shaped structures 212 extend vertically along the Z direction from the substrate 202. Each of the fin-shaped structures 212 includes a bottom portion formed from the substrate and a top portion formed from the stack 204. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 212 by etching the stack 204 and the substrate 202. The etching process can include dry etching, wet etching, reactive ion etching (RIE), and/or other suitable processes.

Referring still to FIGS. 1 and 4, method 100 includes a block 108 where an isolation feature 214 is formed. After the fin-shaped structures 212 are formed, isolation feature 214 is formed between neighboring fin-shaped structures 212. The isolation feature 214 may also be referred to as a shallow trench isolation (STI) feature 214. In an example process, a dielectric layer is first deposited over the workpiece 200, filling the trenches between fin-shaped structures 212 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, spin-on coating, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the isolation feature 214. As shown in FIG. 4, top portions of the fin-shaped structures 212 rise above the isolation feature 214. Although not explicitly shown in FIG. 4, the hard mask layer 210 may also be removed during the formation of the isolation feature 214.

Figure 5:
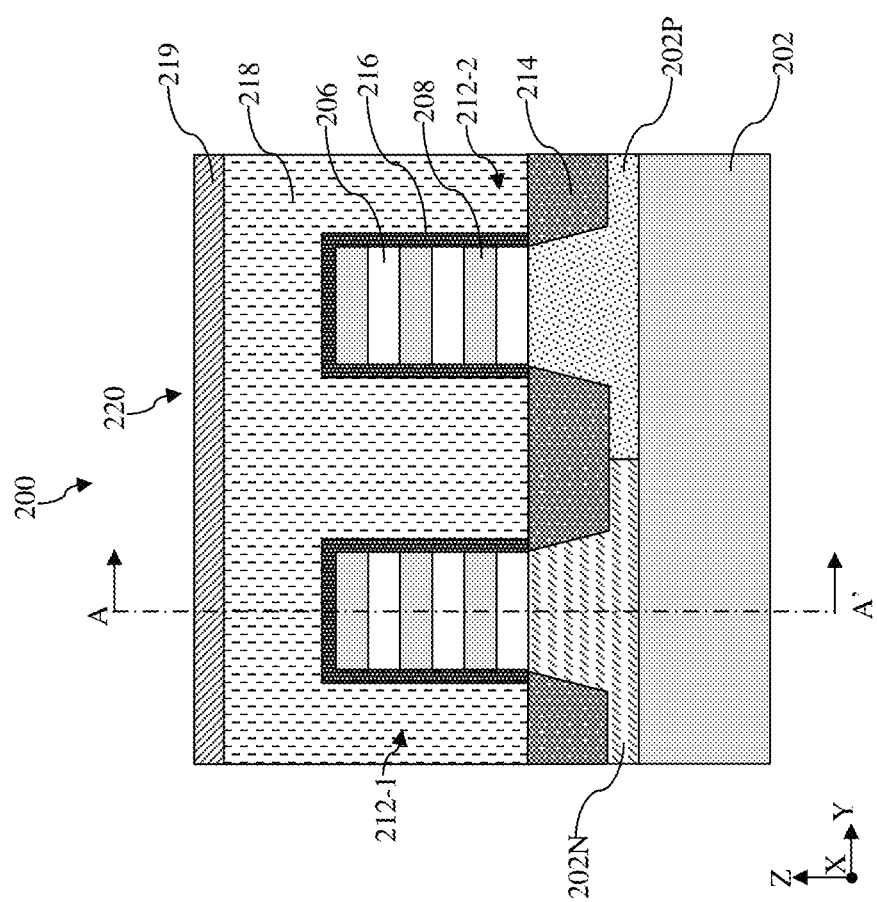
Figure 6:
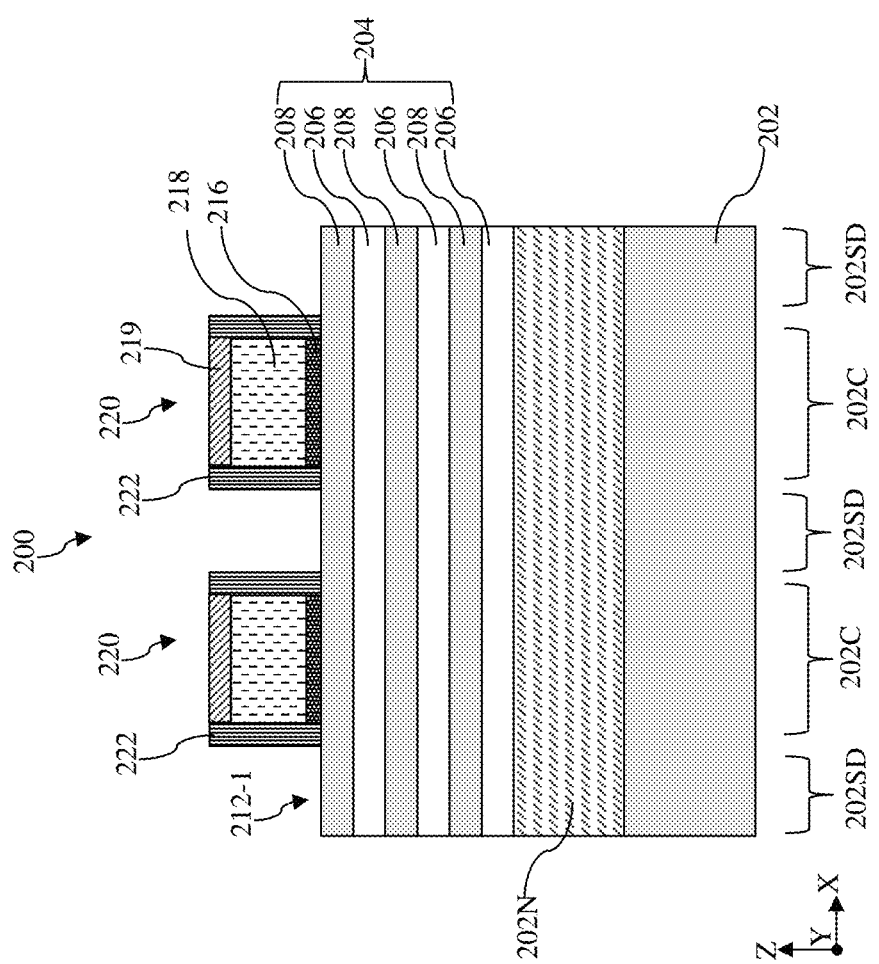

Referring to FIGS. 1, 5 and 6, method 100 includes a block 110 where a dummy gate stack 220 is formed the fin-shaped structures 212. In some embodiments, a gate replacement process (or gate-last process) is adopted where the dummy gate stack 220 serves as placeholders for a functional gate structure. Other processes and configuration are possible. In some embodiments, the dummy gate stack 220 is formed over the isolation feature 214 and is at least partially disposed over the fin-shaped structures 212. As shown in FIG. 5, the dummy gate stack 220 extends lengthwise along the Y direction to wrap over the first fin-shaped structure 212-1 and the second fin-shaped structure 212-2. The dummy gate stack 220 includes a dummy dielectric layer 216 and a dummy gate electrode 218. To illustrate how the dummy gate stack 220 is disposed over the fin-shaped structures 212, a cross-sectional view along the cross-section A-A' is provided in FIG. 6. As shown in FIG. 6, the portion of the fin-shaped structures 212 underlying the dummy gate stack 220 are channel regions 202C. The channel regions 202C also define the source/drain regions 202SD that are not vertically overlapped by the dummy gate stack 220. Each of the channel regions 202C is disposed between two source/drain regions 202SD. It is noted that because the cross-sectional view in FIG. 6 slices through the first fin-shaped structure 212-1, the isolation feature 214 is not shown in FIG. 6.

In some embodiments, the dummy gate stack 220 is formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In an example process, the dummy dielectric layer 216, a dummy electrode layer for the dummy gate electrode 218, and a gate top hard mask layer 219 are sequentially deposited over the workpiece 200, including over the fin-shaped structures 212 (including the first fin-shaped structure 212-1 and the second fin-shaped structure 212-2). The deposition may be done by using a CVD process, a sub-atmospheric CVD (SACVD) process, a flowable CVD process, an ALD process, a PVD process, or other suitable process. The dummy dielectric layer 216 and the dummy electrode layer are then patterned using photolithography processes to form the dummy gate stack 220. In some embodiments, the dummy dielectric layer 216 may include silicon oxide and the dummy gate electrode 218 may include polycrystalline silicon (polysilicon). The gate top hard mask layer 219 may include a silicon oxide layer and a nitride layer. By way of example, the dummy dielectric layer 216 may be used to prevent damages to the fin-shaped structures 212 during subsequent processes (e.g., formation of the dummy gate stack). In some embodiments, the gate spacer layer 222 may have a thickness (along the X direction) between about 3 nm and about 12 nm.

Referring to FIG. 6, after formation of the dummy gate stack 220, the dummy dielectric layer 216 that is not covered by the dummy gate electrode 218 is removed. The removal process may include a wet etch, a dry etch, and/or a combination thereof. The etch process is chosen to selectively etch the dummy dielectric layer 216 without substantially etching the fin-shaped structures 212 and the dummy gate electrode 218. After the excess dummy dielectric layer 216 is removed from over the fin-shaped structure 212, a gate spacer layer 222 is formed alongside sidewalls of the dummy gate stack 220. In some embodiments, the formation of the gate spacer layer 222 includes conformal deposition of one or more dielectric layers over the workpiece 200 and etch-back of the gate spacer layer 222 from top-facing surfaces of the workpiece 200. In an example process, the one or more dielectric layers are deposited using CVD, SACVD, or ALD and are etched back in an anisotropic etch process to form the gate spacer layer 222. The gate spacer layer 222 may include silicon oxide, silicon nitride, silicon carbide, silicon oxynitride, silicon carbonitride, silicon oxycarbide, silicon oxycarbonitride, and/or combinations thereof.

Figure 19:
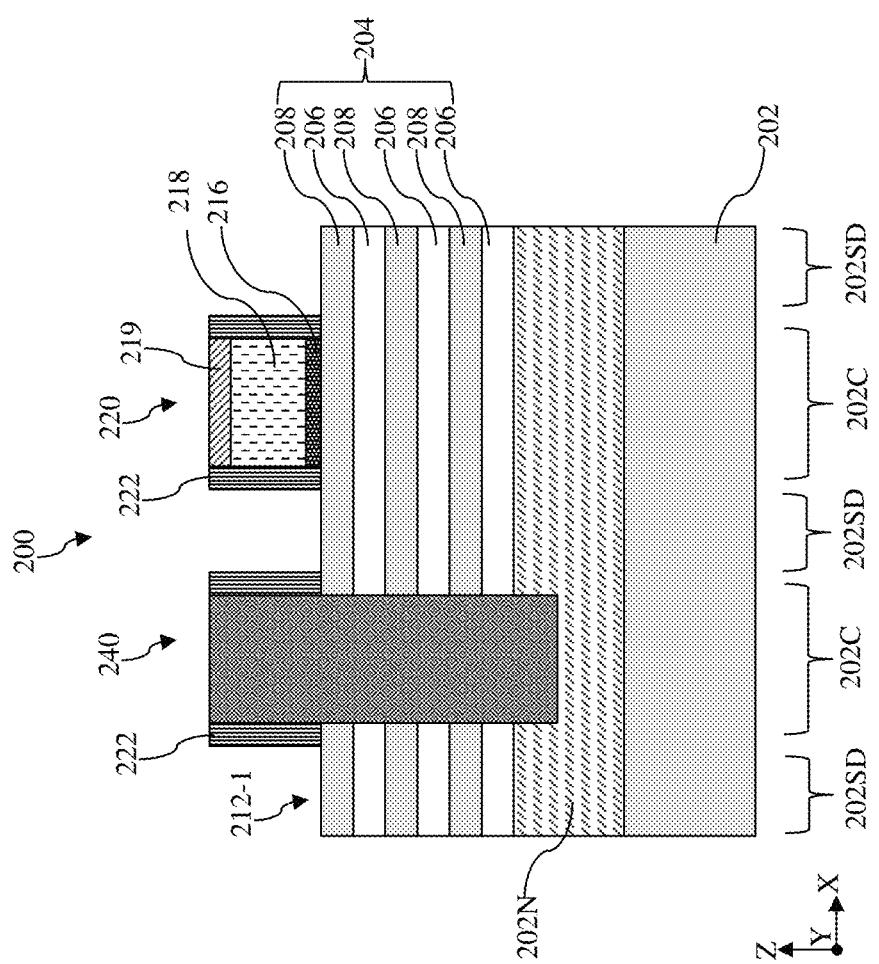

In some embodiments, an isolation gate structure may be formed to divide a fin-shaped structure 212 into two segments. The isolation gate structure may be formed before the dummy gate stack 220 but after the formation of the gate spacer layer 222. An example is illustrated in FIG. 19, which illustrate an isolation gate structure 240 alongside a dummy gate stack 220. The isolation gate structure 240 extends lengthwise along the Y direction, in parallel with the dummy gate stack 220. Different from the dummy gate stack 220, the isolation gate structure 240 is insulative and is formed of a dielectric material, such as silicon nitride or a metal oxide. Example metal oxides include aluminum oxide, zirconium oxide, titanium oxide, tantalum oxide, or hafnium oxide. To form an isolation gate structure, the fin-shaped structure 212 may first be etched to form a trench that extends through the stack 204 and then a dielectric material may then be deposited into the trench to form the isolation gate structure. For satisfactory isolation, the trench as well as the isolation gate structure should completely sever the fin-shaped structure. As shown in FIG. 19, the isolation gate structure 240 extends through the first fin-shaped structure 212-1 into the n-well 202N. Because the gate spacer layer 222 is formed after the formation of the isolation gate structure 240, it is disposed on sidewalls of the isolation gate structure 240.

It is noted that FIG. 6, as well as subsequent FIGS. 7-24, only illustrate the cross-sectional view across the n-well 202N along the Y direction. Similar processes may be performed to the structures over the p-well 202P either sequentially using different sets of photolithography masks or simultaneously using the same set of the photolithography mask.

Figure 7:
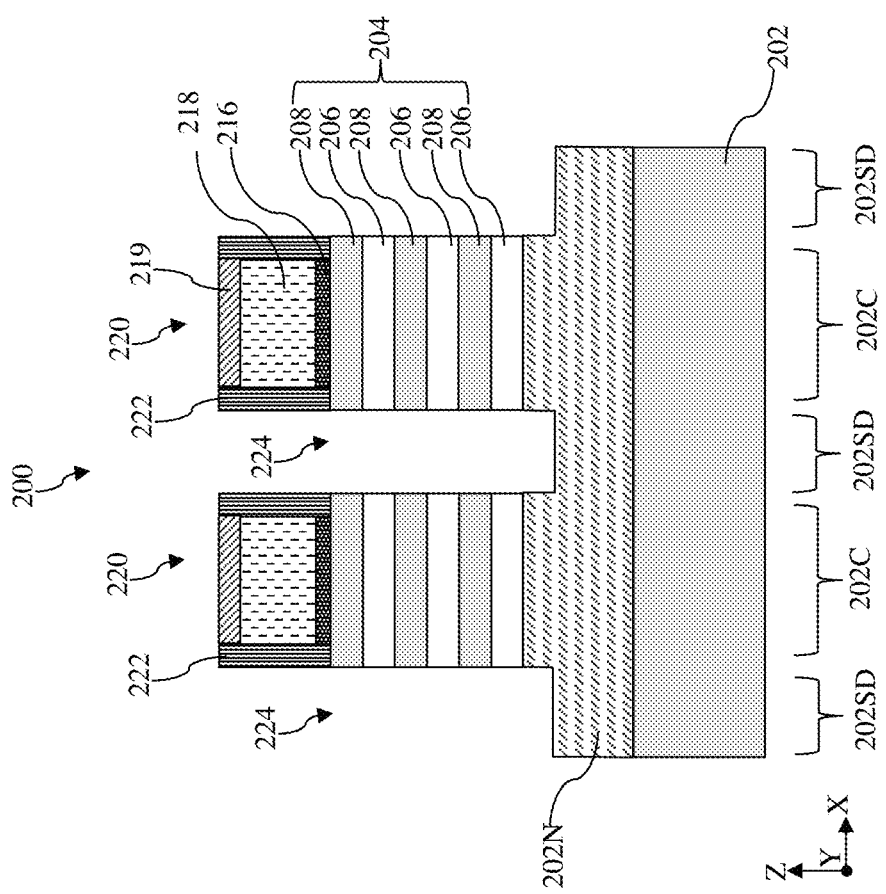
Figure 20:
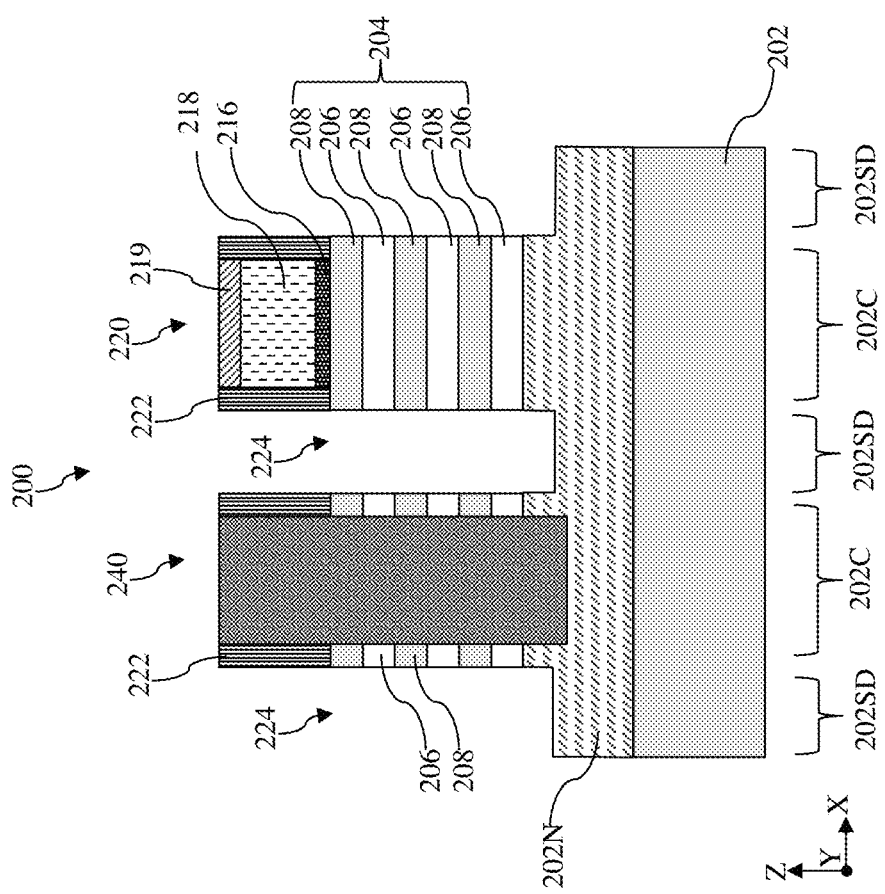

Referring to FIGS. 1, 7 and 20, method 100 includes a block 112 where source/drain trenches 224 are formed in the fin-shaped structures 212. In embodiments represented in FIGS. 7 and 20, the source/drain regions 202SD of the first fin-shaped structures 212-1 are recessed to form the source/drain trenches 224. As shown in FIG. 7, the source/drain regions 202SD that are not masked by the gate top hard mask layer 219 or the gate spacer layer 222 are etched. As shown in FIG. 20, in embodiments where the isolation gate structure 240 is implemented, the source/drain regions 202SD that are not masked by the gate spacer layer 222, the isolation gate structure 240, or the gate top hard mask layer 219 are etched. In examples shown in FIGS. 7 and 20, the source/drain trenches 224 may extend partially into the well region (i.e., n-well 202N). The etch process at block 112 may be a dry etch process or a suitable etch process. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIGS. 7 and 20, sidewalls of the sacrificial layers 206 and the channel layers 208 are exposed in the source/drain trenches 224.

Referring to FIGS. 1, 8, 12, and 21, method 100 includes a block 114 where inner spacer recesses are formed. At block 114, the sacrificial layers 206 exposed in the source/drain trenches 224 are selectively and partially recessed to form first inner spacer recesses 226-1 (shown in FIGS. 8 and 21) or second inner spacer recesses 226-2 (shown in FIG. 12), while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may be a selective isotropic etching process (e.g., a selective dry etching process or a selective wet etching process), and the extent the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant.

Figure 8:
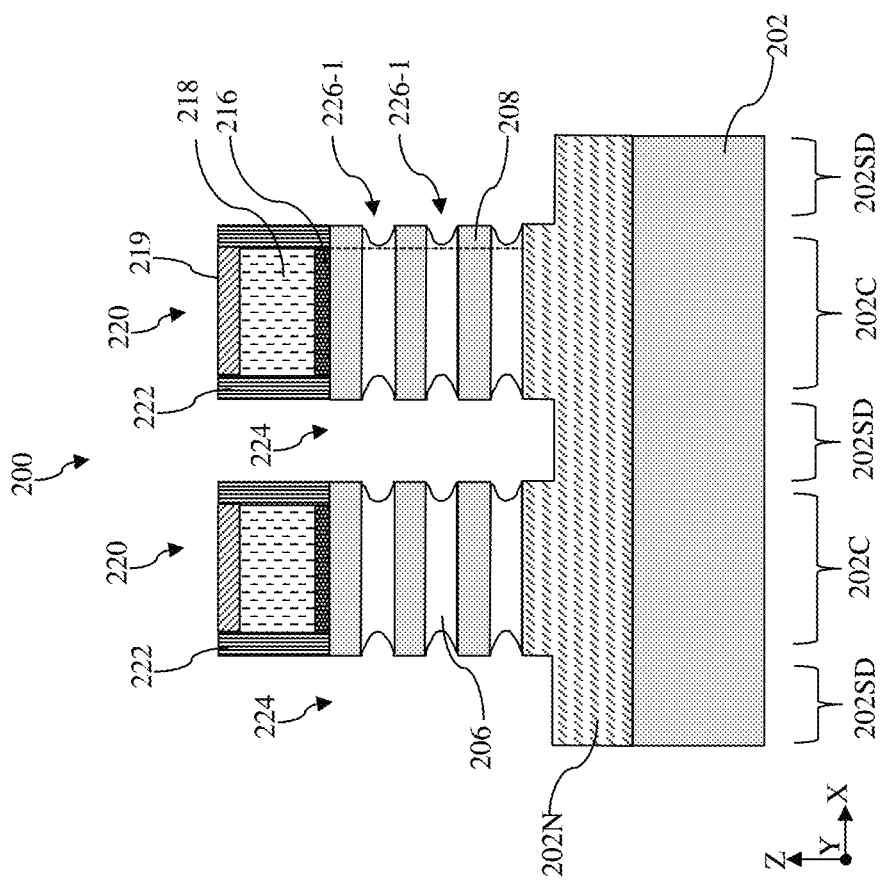
Figure 12:
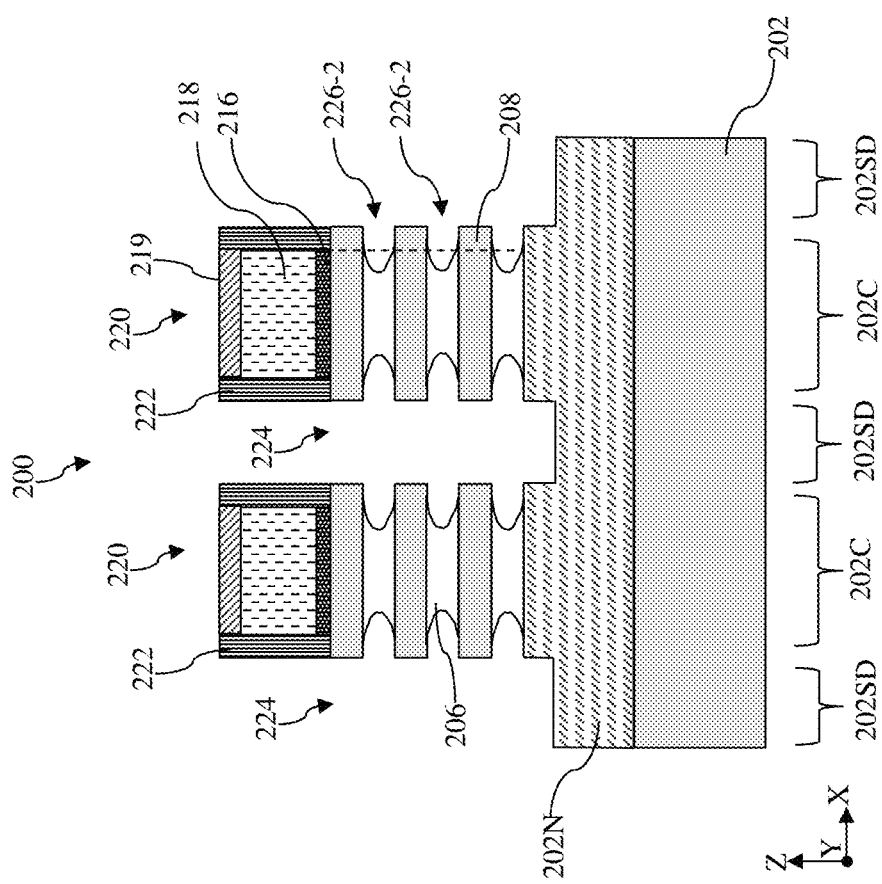
Figure 21:
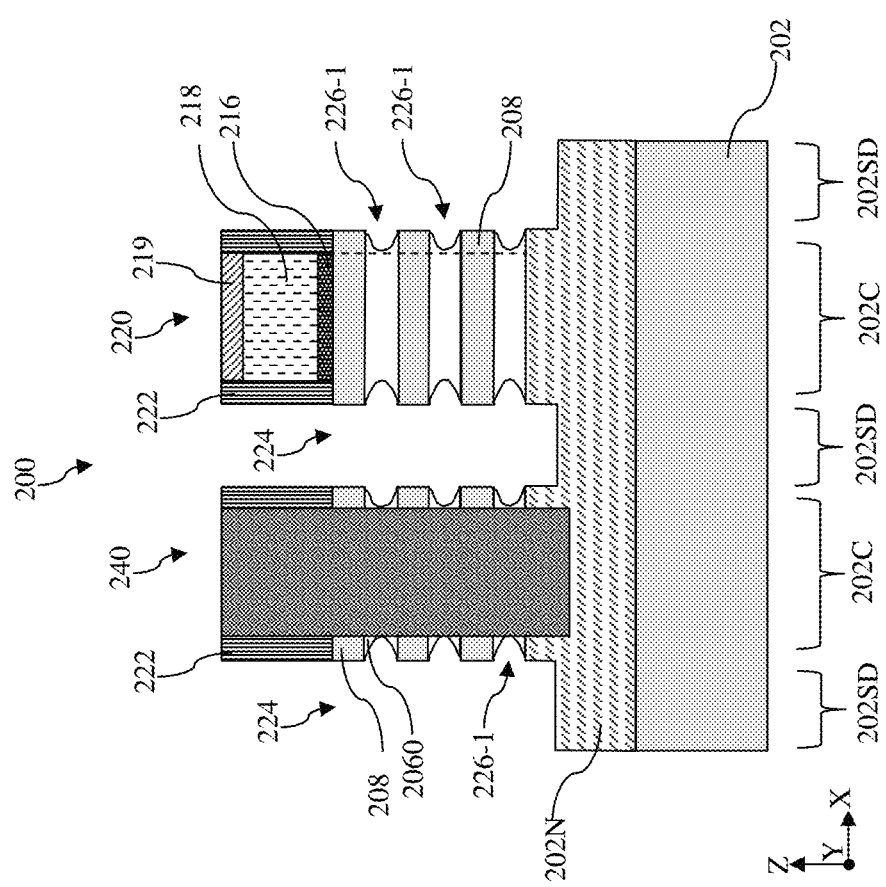

In some embodiments, a first inner spacer recess 226-1 in FIGS. 8 and 21 is different from a second inner spacer recess 226-2 in FIG. 12 in terms of depth along the X direction. Both the first inner spacer recesses 226-1 and the second inner spacer recesses 226-2 extends laterally along the X direction into the channel region 202C. As indicated by the dotted lines in FIGS. 8, 12, and 21, the first inner spacer recess 226-1 does not extend under the dummy gate electrode 218 while the second inner spacer recess 226-2 extends under the dummy gate electrode 218. In other words, the first inner spacer recess 226-1 is completely below the gate spacer layer 222 along the Z direction while the second inner spacer recess 226-2 is below both the gate spacer layer 222 and the dummy gate electrode 218 along the Z direction. When viewed along the Y direction, both the first inner spacer recess 226-1 and the second inner spacer recess 226-2 are concave and have a C-shape profile.

Figure 9:
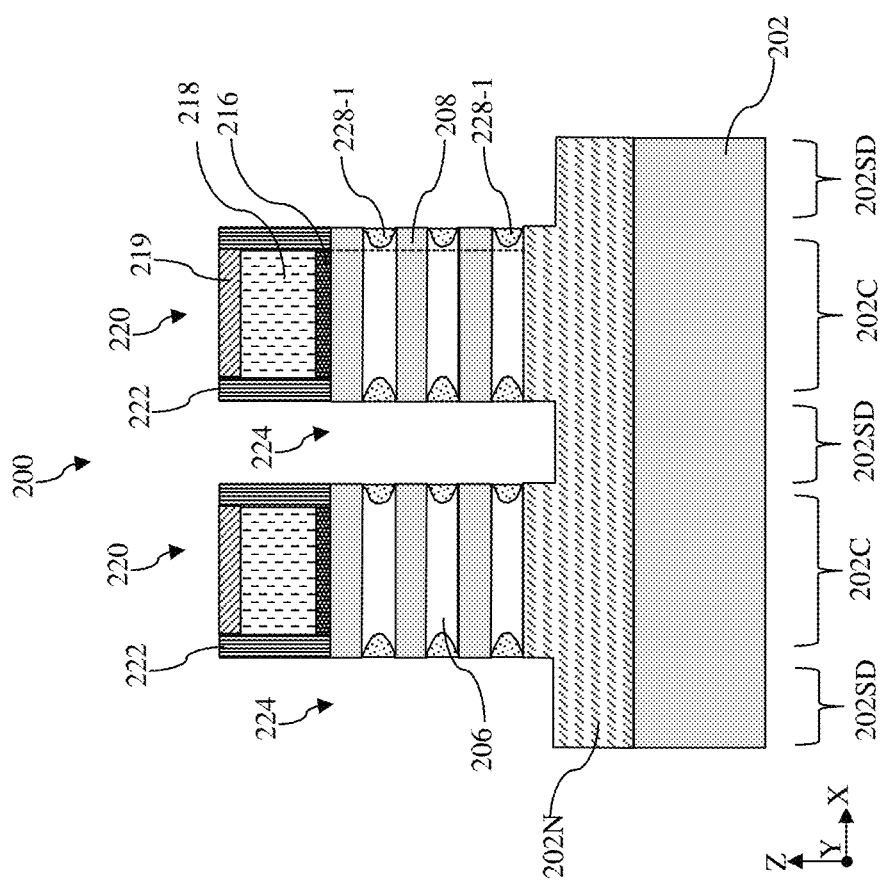
Figure 10:
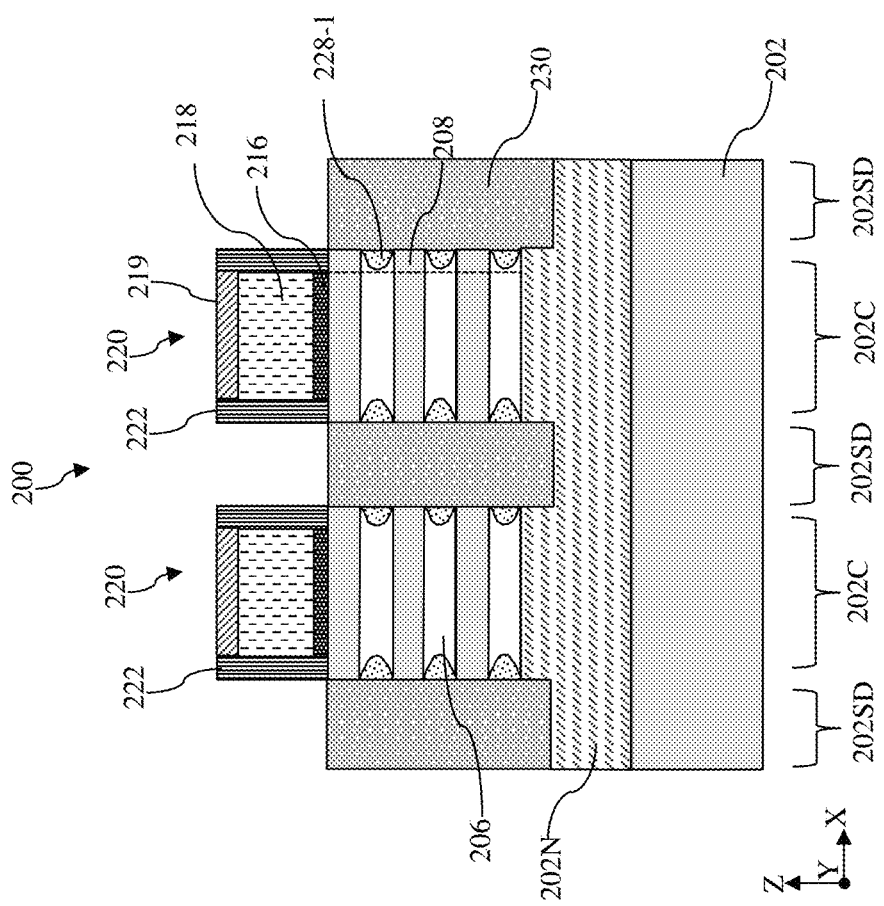
Figure 13:
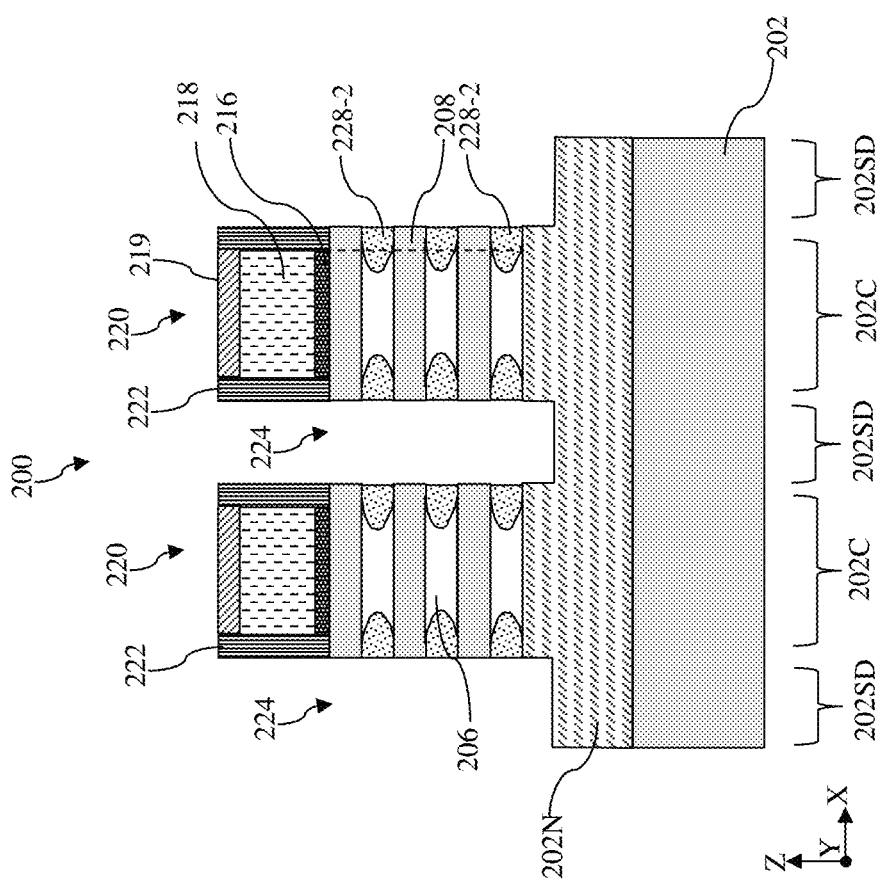
Figure 14:
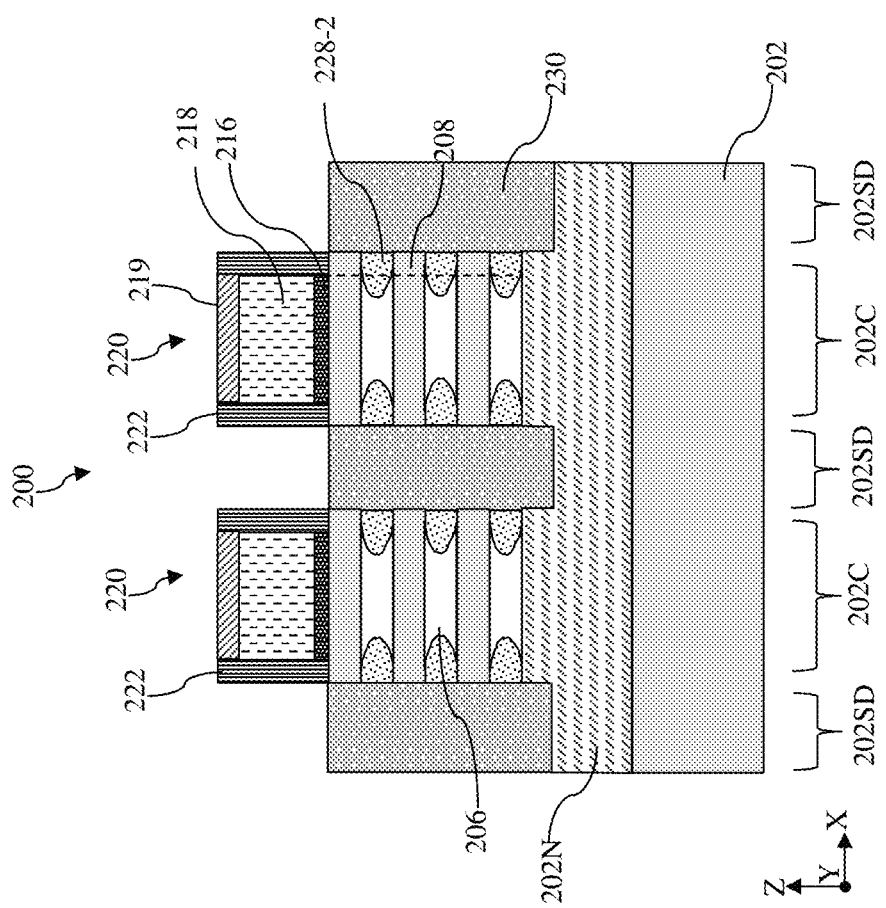
Figure 16:
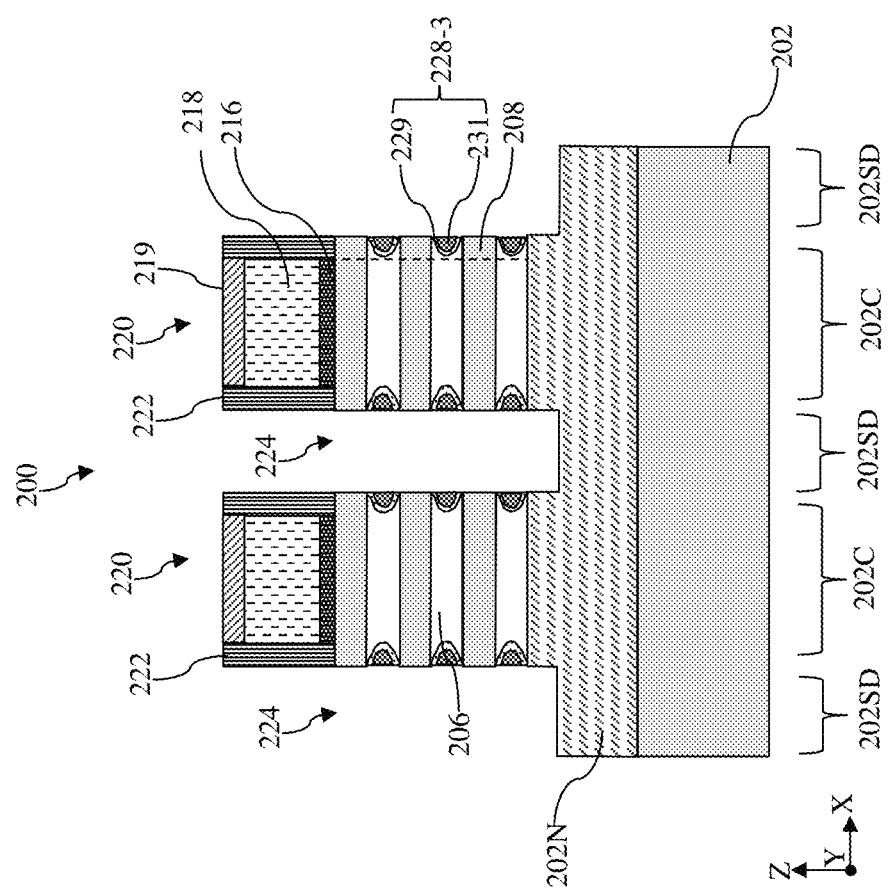
Figure 17:
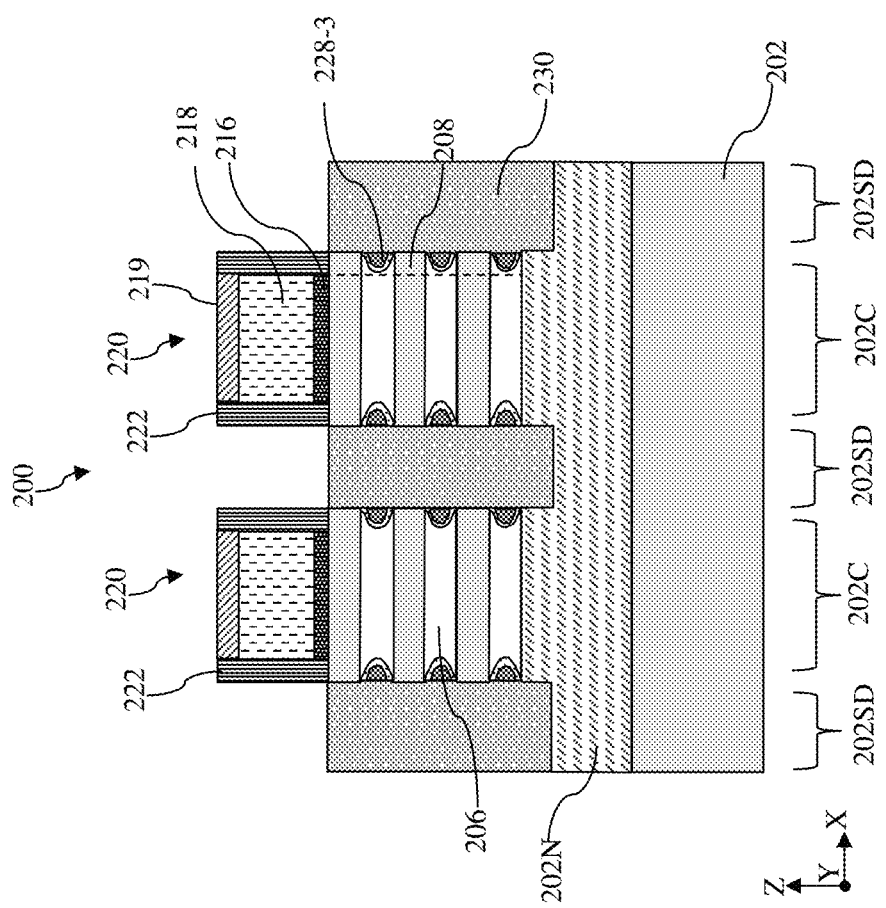
Figure 22:
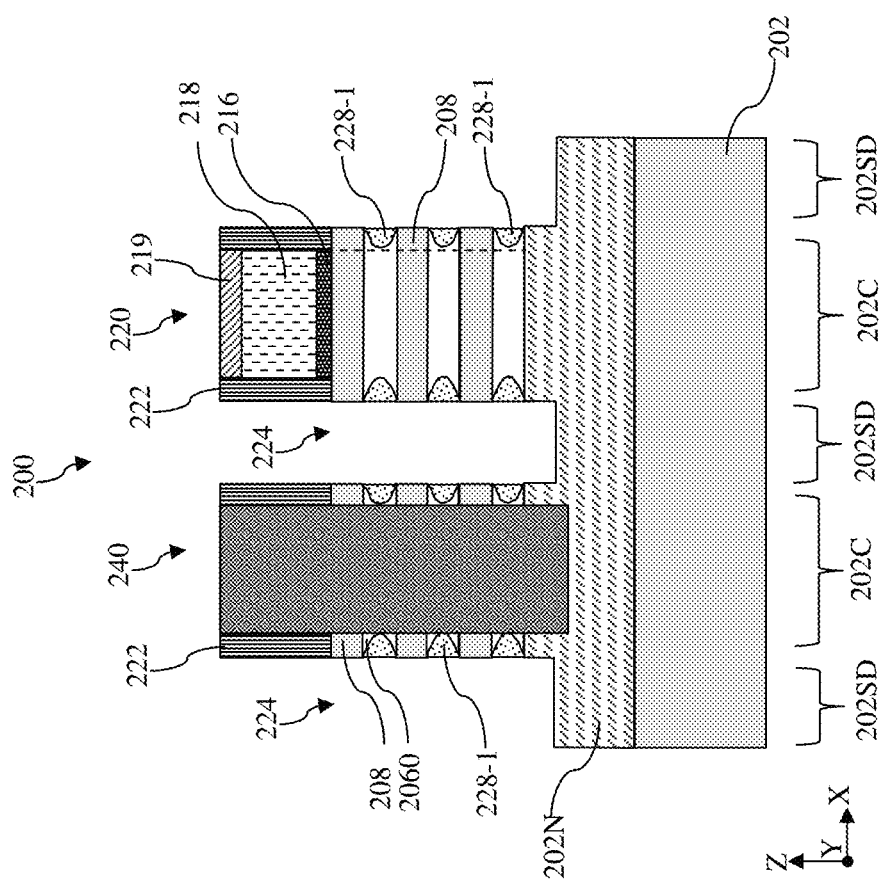
Figure 23:
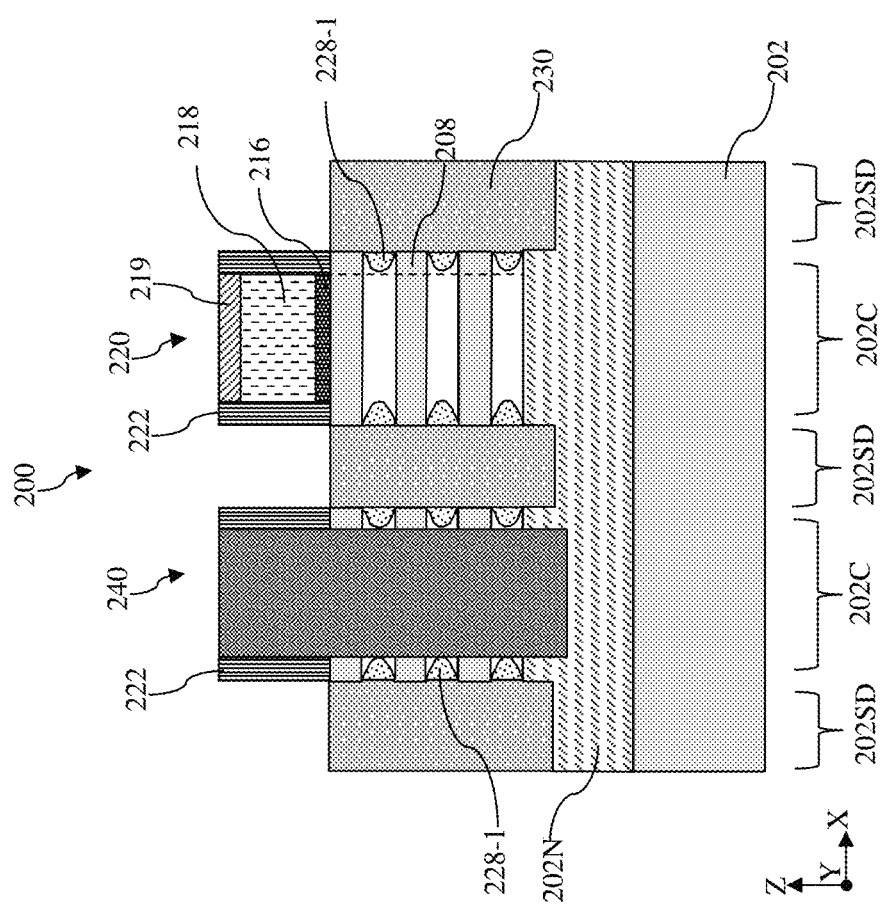

Referring to FIGS. 1, 9, 13, 16, and 22, method 100 includes a block 116 where inner spacer features are formed in the inner spacer recesses. The present disclosure provides different example implementations of inner spacer features. FIG. 9 illustrates an example where first inner spacer features 228-1 are formed into first inner spacer recesses 226-1. Because the first inner spacer recesses 226-1 do not extend under the dummy gate stack 220, neither do the first inner spacer features 228-1. FIG. 13 illustrates an example where second inner spacer features 228-2 are formed into second inner spacer recesses 226-2. Because the second inner spacer recesses 226-2 extend under the dummy gate stack 220, the second inner spacer features 228-2 also extend under the dummy gate stack 220. FIG. 16 illustrates an example where third inner spacer features 228-3 are formed into first inner spacer recesses 226-1. Different from the first inner spacer feature 228-1 and the second inner spacer feature 228-2, the third inner spacer feature 228-3 is a multilayer and includes a liner layer 229 and a filler layer 231. While the third inner spacer features 228-3 are shown to be formed into the first inner spacer recesses 226-1, they may also be formed into second inner spacer recesses 226-2. FIG. 22 illustrates an example where first inner spacer features 228-1 are formed into first inner spacer recesses 226-1 adjacent an isolation gate structure 240.

In an example process, inner spacer layer(s) are first conformally deposited using CVD, PECVD, LPCVD, ALD or other suitable method over the workpiece 200 and are then etched back to remove inner spacer layer(s) outside of the inner spacer recesses. In the example shown in FIG. 9, an inner spacer layer for the first inner spacer feature 228-1 is first deposited over the workpiece 200, including the surfaces of the n-well 202N, the first inner spacer recesses 226-1, the channel layers 208, and the gate spacer layer 222. The deposited inner spacer layer is then etched back to remove the inner spacer layer on the channel layers 208 and the gate spacer layer 222 to form the first inner spacer features 228-1. The inner spacer layer may include silicon oxide, silicon nitride, silicon oxynitride, silicon oxycarbide, or silicon oxycarbonitride. In the example shown in FIG. 13, an inner spacer layer for the second inner spacer feature 228-2 is first deposited over the workpiece 200, including the surfaces of the n-well 202N, the second inner spacer recesses 226-2, the channel layers 208, and the gate spacer layer 222. The deposited inner spacer layer is then etched back to remove the inner spacer layer on the channel layers 208 and the gate spacer layer 222 to form the second inner spacer features 228-2. The second inner spacer feature 228-2 and the first inner spacer feature 228-1 may have the same composition.

In the example shown in FIG. 16, the liner layer 229 and the filler layer 231 are sequentially and conformally deposited over the workpiece 200, including the surfaces of the n-well 202N, the first inner spacer recesses 226-1, the channel layers 208, and the gate spacer layer 222. The deposited liner layer 229 and filler layer 231 are then etched back to remove excess liner layer 229 and filler layer 231 on the channel layers 208 and the gate spacer layer 222 to form the third inner spacer features 228-3. While the liner layer 229 and the filler layer 231 may be selected from a group consisting of silicon oxide, silicon nitride, silicon oxynitride, silicon oxycarbide, and silicon oxycarbonitride, a composition of the liner layer 229 is different from the filler layer 231. In some instances, a dielectric constant of the liner layer 229 is greater than a dielectric constant of the filler layer 231. In one example, the dielectric constant of the liner layer 229 is greater than 4.6 and the dielectric constant of the filler layer 231 is smaller than 4.6 In some instances, a nitrogen content of the liner layer 229 is greater than a nitrogen content of the filler layer 231. It has been observed that dielectric constant and nitrogen content may serve as proxies for greater etch resistance. The liner layer 229 is in direct contact with the channel layers 208 and requires a greater etch resistance to protect the channel layers 208. In addition, the greater nitrogen content tends to result in denser construction and lesser oxygen content, both of which are beneficial when it comes protecting the channel layers from being oxidized.

In the example shown in FIG. 22, an inner spacer layer for the first inner spacer feature 228-1 is first deposited over the workpiece 200, including the surfaces of the n-well 202N, the first inner spacer recesses 226-1, the channel layers 208, and the gate spacer layer 222. The deposited inner spacer layer is then etched back to remove the inner spacer layer on the channel layers 208 and the gate spacer layer 222 to form the first inner spacer features 228-1. As shown in FIG. 22, the first inner spacer feature 228-1 may be adjacent or in contact with the isolation gate structure 240. The partially recessed sacrificial layers 206 adjacent the isolation gate structure 240 may become capped or sealed by the first inner spacer feature 228-1. For ease of reference, the recessed sacrificial layers 206 adjacent the isolation gate structure 240 may be referred to as a bullhorn feature 2060. Because the isolation gate structure 240 will not be removed when the dummy gate stack 220 is removed, the bullhorn features 2060 will remain in the final structure of the semiconductor device 200. As shown in FIG. 22, when viewed along the Y direction, each of the first inner spacer features 228-1 is convex and each of the bullhorn features 2060 is concave to accommodate the convex first inner spacer feature 228-1. The tips or horns of the bullhorn feature 2060 extend between the first inner spacer feature 228-1 and the channel layer 208.

Referring to FIGS. 1, 10, 14, 17, and 23, method 100 includes a block 118 where source/drain features 230 are formed in the source/drain trenches 224. In some embodiments, the source/drain features 230 may be formed using an epitaxial process, such as vapor-phase epitaxy (VPE), ultra-high vacuum CVD (UHV-CVD), molecular beam epitaxy (MBE), and/or other suitable processes. The epitaxial growth process may use gaseous and/or liquid precursors, which interact with the composition of the substrate 202 as well as the channel layers 208. In the embodiments represented in FIGS. 10, 14, 17, and 23, the source/drain features 230 formed over the n-well 202N are p-type source/drain features. While not explicitly shown in the drawings, the source/drain features 230 formed over the p-well 202P are n-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or both. When the source/drain features 230 are not in-situ doped with an n-type dopant, an implantation process (i.e., a junction implant process) may be performed to dope the source/drain features 230 with an n-type dopant. Example p-type source/drain features may include Si, Ge, AlGaAs, SiGe, boron-doped SiGe, or other suitable material and may be in-situ doped during the epitaxial process by introducing a p-type dopant. When the source/drain features 230 are not in-situ doped with a p-type dopant, an implantation process (i.e., a junction implant process) may be performed to dope the source/drain features 230 with a p-type dopant.

Referring to FIGS. 1, 11, 15, 18, and 24, method 100 includes a block 120 where a contact etch stop layer (CESL) 233 is deposited over the workpiece 200. The CESL 233 may include silicon nitride, silicon oxide, silicon oxynitride, and/or other materials known in the art. The CESL 233 may be formed by ALD, plasma-enhanced chemical vapor deposition (PECVD) process and/or other suitable deposition or oxidation processes. As shown in FIGS. 11, 15, 18, and 24, the CESL 233 may be deposited on top surfaces of the source/drain features 230 and along sidewalls of the gate spacer layer 222. Although the CESL 233 is also deposited over the top surface of the gate spacer layer 222, the gate top hard mask layer 219, and the isolation gate structure 240, FIGS. 11, 15, 18, and 24 only illustrate cross-sectional views after the dummy gate stack 220 is removed and replaced with a gate structure 234.

Referring to FIGS. 1, 11, 15, 18, and 24, method 100 includes a block 122 where an interlayer dielectric (ILD) layer 232 is deposited over the workpiece 200. At block 122, the ILD layer 232 is deposited over the CESL 233. In some embodiments, the ILD layer 232 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 232 may be deposited by a PECVD process or other suitable deposition technique. In some embodiments, after formation of the ILD layer 232, the workpiece 200 may be annealed to improve integrity of the ILD layer 232. To remove excess materials and to expose top surfaces of the dummy gate stacks 220, a planarization process, such a chemical mechanical polishing (CMP) process may be performed.

Referring to FIGS. 1, 11, 15, 18, and 24, method 100 includes a block 124 where the dummy gate stack 220 is removed. In some embodiments, the removal of the dummy gate stacks 220 results in gate trenches over the channel regions 202C. A gate structure 234 (to be described below) may be subsequently formed in the gate trenches, as will be described below. The removal of the dummy gate stacks 220 may include one or more etching processes that are selective to the material in the dummy gate stack 220. For example, the removal of the dummy gate stack 220 may be performed using as a selective wet etch, a selective dry etch, or a combination thereof. After the removal of the dummy gate stacks 220, sidewalls of the channel layers 208 and sacrificial layers 206 in the channel regions 202C are exposed in the gate trenches.

Referring to FIGS. 1, 11, 15, 18, and 24, method 100 includes a block 126 where the sacrificial layers 206 in the channel regions 202C are selectively removed to release channel members 208. After the removal of the dummy gate stacks 220, method 100 may include operations to selectively remove the sacrificial layers 206 between the channel layers 208 in the channel regions 202C. The selective removal of the sacrificial layers 206 releases the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as $NH_4OH$.

Referring to FIGS. 1, 11, 15, 18, and 24, method 100 includes a block 128 where a gate structure 234 is formed over and around the channel members 208. At block 128, the gate structure 234 is formed within the gate trenches over the workpiece 200 and is deposited in the space left behind by the removal of the sacrificial layers 206 in the channel regions 202C. In this regard, the gate structure 234 wraps around each of the channel members 208 on the Y-Z plane. In some embodiments, the gate structure 234 includes a gate dielectric layer 236 and a gate electrode (including a first gate electrode 238 shown in FIGS. 11, 18, and 24 and a second gate electrode 238' shown in FIG. 15) formed over the gate dielectric layer 236. In an example process, formation of the gate structure 234 may include deposition of the gate dielectric layer 236, deposition of the gate electrode, and a planarization process to remove excess material.

In some embodiments, the gate dielectric layer 236 may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, atomic layer deposition (ALD), chemical vapor deposition (CVD), and/or other suitable method. The high-K dielectric layer may include a high-K dielectric layer such as hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode of the gate structure 234 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode of the gate structure 234 may be formed by ALD, PVD, CVD, e-beam evaporation, or other suitable process. Further, the gate electrode may be formed separately for p-type transistors over the n-well 202N and n-type transistors over p-well 202P, which may use different metal layers (e.g., for providing different n-type and p-type work function metal layers). In various embodiments, a planarization process, such as a CMP process, may be performed to remove excessive metal from the gate electrode of the gate structure 234, and thereby provide a substantially planar top surface of the gate structure 234.

Figure 11:
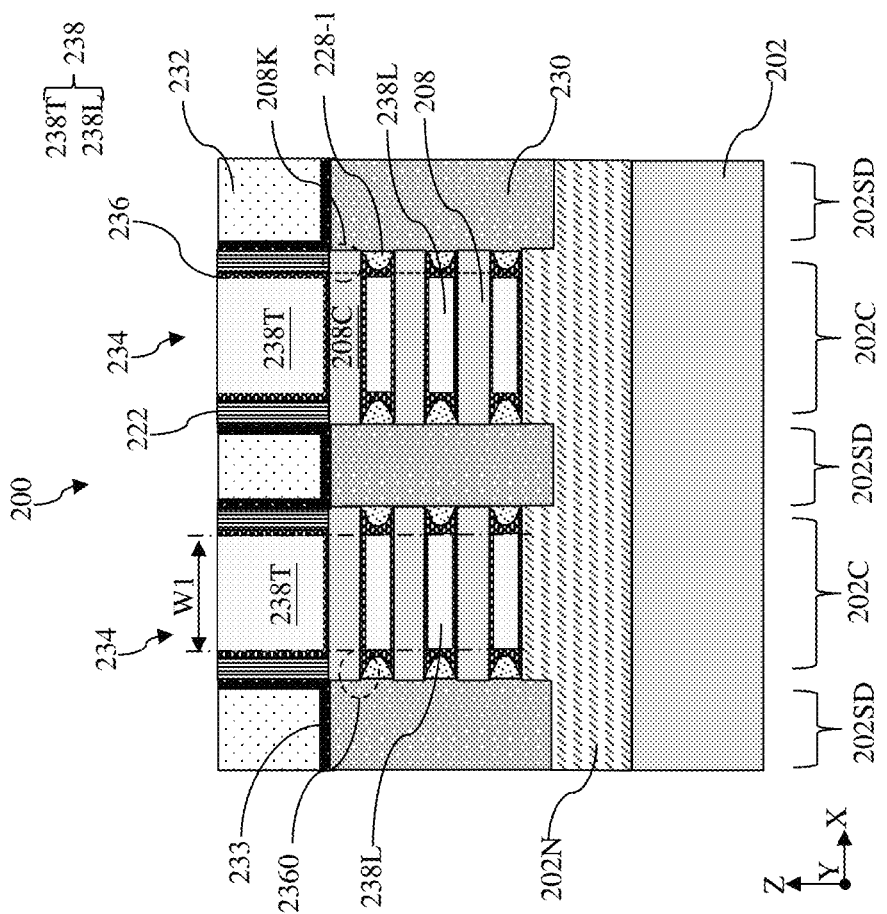

Depending on the type of inner spacer features being used, the gate electrode may have different configurations relative to adjacent structures. Reference is first made to FIG. 11, when the first inner spacer feature 228-1 is implemented, the gate structure 234 includes a first gate electrode 238. The first gate electrode 238 includes a topmost portion 238T above the topmost channel member 208 and a plurality of inter-member portions 238L disposed between two adjacent channel members 208. Each of the channel members 208 includes a channel portion 208C underlying the topmost portion 238T and a connection portion 208K underlying the gate spacer layer 222 along the Z direction. The connection portion 208K is coupled to the source/drain feature and is disposed between the channel portion 208C and the source/drain feature 230. As shown in the FIG. 11, when the first inner spacer feature 228-1 is implemented, the topmost portion 238T and the inter-member portions 238L share the same first width W1 along the X direction. The gate dielectric layer 236 includes tips 2360 that extend about 0.5 nm to about 3 nm between a connection portion 208K and a first inner spacer feature 228-1. As a result, a width of the gate dielectric layer 236 along the X direction is greater than the first width W1. When viewed along the Y direction, each of the first inner spacer feature 228-1 is "hugged" or wrapped by two tips 2360 of the gate dielectric layer 236. The tips 2360 provide benefits. For example, the tips 2360 fill the interface between the first inner spacer feature 228-1 and the connection portion 208K, thus preventing the inter-member portions 238L from extending between the first inner spacer feature 228-1 and the connection portion 208K. In other words, the tips 2360 help maintain satisfactory separation between the gate electrode from the source/drain features 230. For another example, the tips 2360 that include high-k dielectric material may expand the gate control or electric field along the X direction. As a result, a longer effective channel length may be obtained although the actual channel length remains the same. The longer effective channel length may contribute to On-state drive improvement as well as Off-state leakage current (Ioff) reduction. For at least these reasons, the convex shape or C-shape of the first inner spacer feature 228-1 is not trivial.

Figure 15:
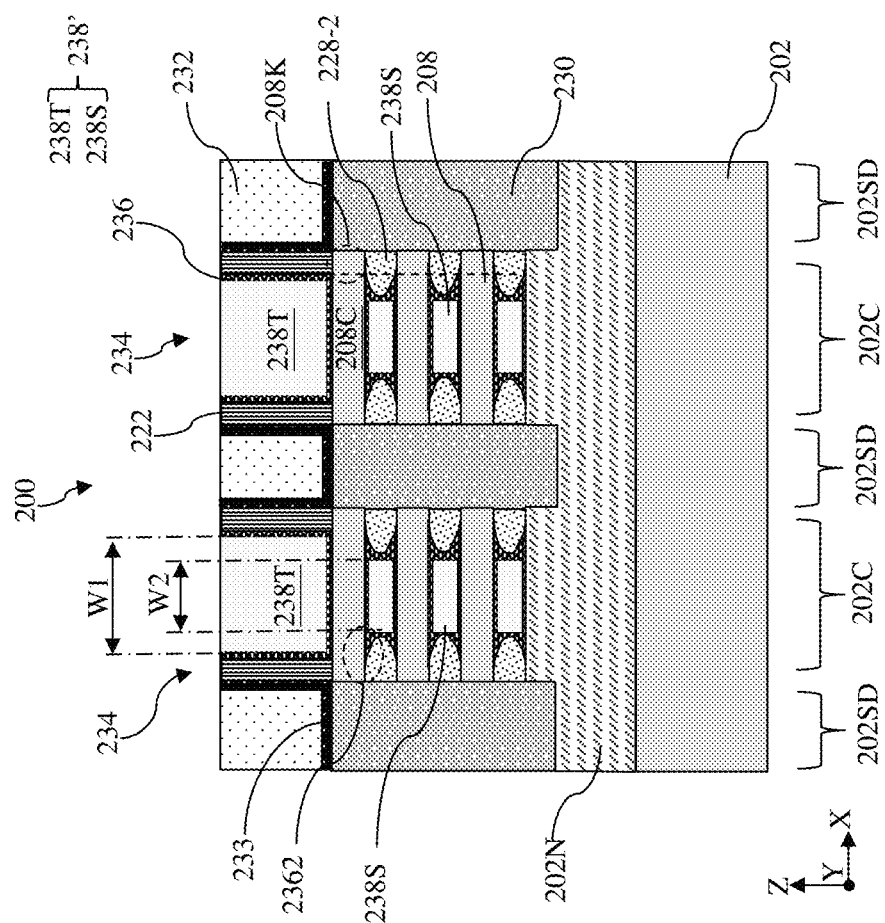

Reference is then made to FIG. 15, when the second inner spacer feature 228-2 is implemented, the gate structure 234 includes a second gate electrode 238'. The second gate electrode 238' includes a topmost portion 238T above the topmost channel member 208 and a plurality of short inter-member portions 238S disposed between two adjacent channel members 208. Each of the channel members 208 includes a channel portion 208C underlying the topmost portion 238T and a connection portion 208K underlying the gate spacer layer 222 along the Z direction. The connection portion 208K is coupled to the source/drain feature and is disposed between the channel portion 208C and the source/drain feature 230. As shown in the FIG. 15, when the second inner spacer feature 228-2 is implemented, the topmost portion 238T has the first width W1 while the short inter-member portions 238S has a smaller second width W2. In some embodiments, a different between the first width W1 and the second width W2 may be between about 0.5 nm and about 3 nm. The shorter inter-member portions 238S is shorter because the second inner spacer feature 228-2 extends under the topmost portion 238T. When the second inner spacer feature 228-2 is implemented, the gate dielectric layer 236 includes long tips 2362 that extend about 1.5 nm to about 4 nm between a connection portion 208K and a second inner spacer feature 228-2. As a result, in some instances, a width of the gate dielectric layer 236 along the X direction may be greater than the first width W1. When viewed along the Y direction, each of the second inner spacer feature 228-2 is "hugged" or wrapped by two long tips 2362 of the gate dielectric layer 236. The long tips 2362 provide similar benefits as the tips 2360. The longer second inner spacer features 228-2 may create greater separation between the second gate electrode 238' and the source/drain features 230 to further reduce parasitic capacitance.

Figure 18:
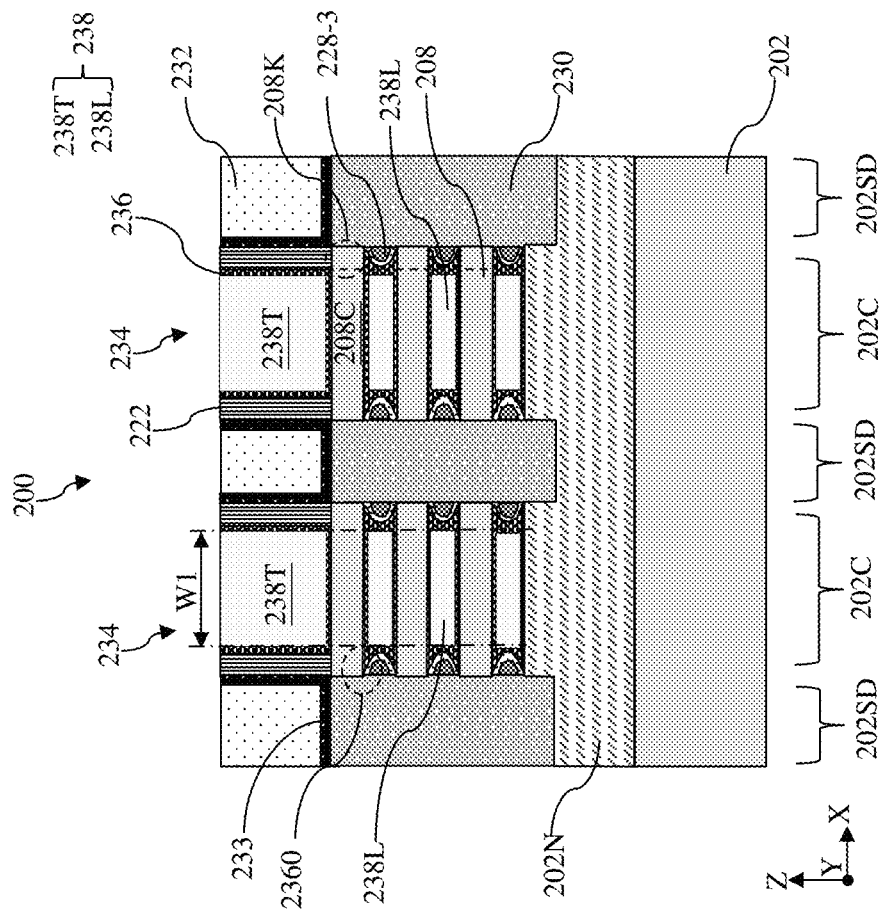

Reference is first made to FIG. 18, when the third inner spacer feature 228-3 is implemented, the gate structure 234 includes a first gate electrode 238. The first gate electrode 238 includes a topmost portion 238T above the topmost channel member 208 and a plurality of inter-member portions 238L disposed between two adjacent channel members 208. Each of the channel members 208 includes a channel portion 208C underlying the topmost portion 238T and a connection portion 208K underlying the gate spacer layer 222 along the Z direction. The connection portion 208K is coupled to the source/drain feature and is disposed between the channel portion 208C and the source/drain feature 230. As shown in the FIG. 18, when the third inner spacer feature 228-3 is implemented, the topmost portion 238T and the inter-member portions 238L share the same first width W1 along the X direction. The gate dielectric layer 236 includes tips 2360 that extend between a connection portion 208K and a third inner spacer feature 228-3. When viewed along the Y direction, each of the third inner spacer feature 228-3 is "hugged" or wrapped by two tips 2360 of the gate dielectric layer 236. Benefits of the tips 2360 have been described above and will be omitted here for brevity.

Figure 24:
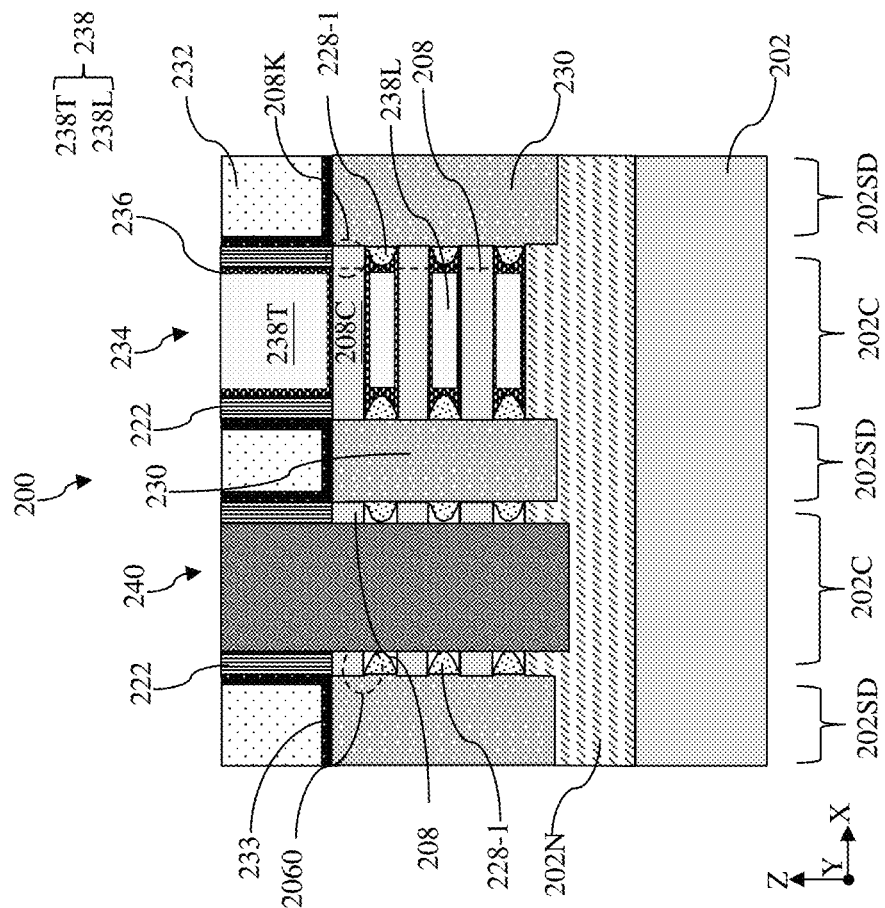

Reference is now made to FIG. 24. The configurations of the first inner spacer features 228-1, the first gate electrode 238, and channel members 208 have been described above with respect to FIG. 11 and will be omitted here for brevity. The partially recessed sacrificial layers 206 adjacent the isolation gate structure 240 may become capped or sealed by the first inner spacer feature 228-1. For ease of reference, the recessed sacrificial layers 206 adjacent the isolation gate structure 240 may be referred to as a bullhorn feature 2060. Because the isolation gate structure 240 will not be removed when the dummy gate stack 220 is removed, the bullhorn features 2060 will remain in the final structure of the semiconductor device 200. As shown in FIG. 24, when viewed along the Y direction, each of the first inner spacer features 228-1 is convex and each of the bullhorn features 2060 is concave to accommodate the convex first inner spacer feature 228-1. The tips or horns of the bullhorn feature 2060 extend between the first inner spacer feature 228-1 and the channel layer 208.

Figure 25:
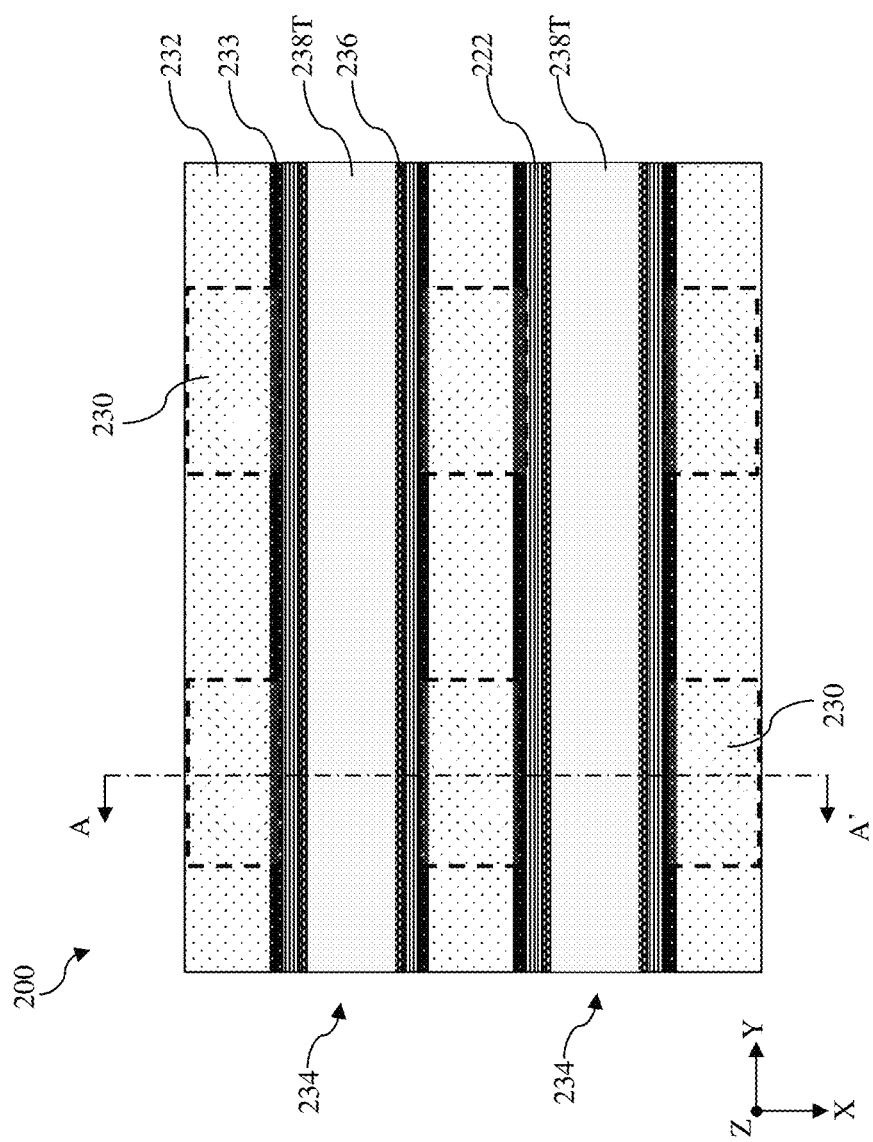
FIGS. 25-26 illustrate fragmentary top views of a workpiece after a fabrication process according to the method of FIG. 1, according to one or more aspects of the present disclosure.
Figure 26:
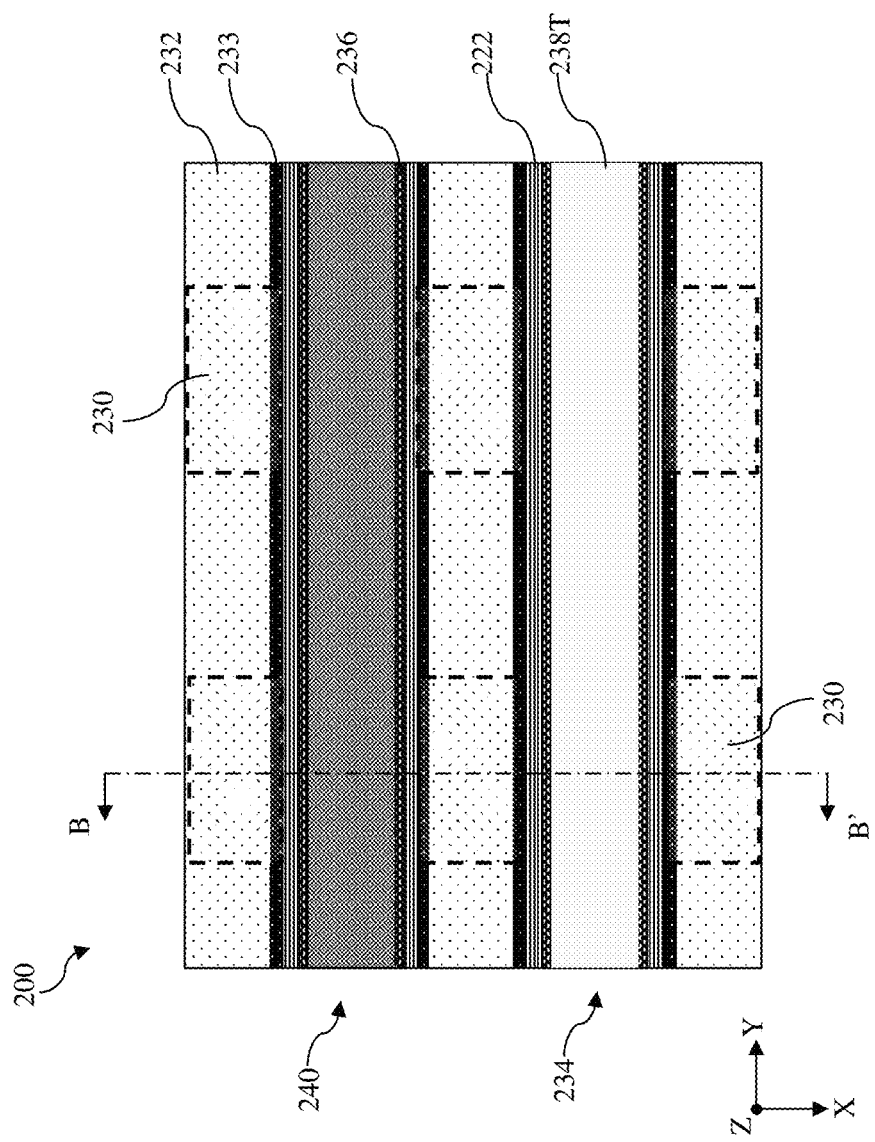

FIG. 25 illustrates a fragmentary top view of the workpiece 200 shown in FIGS. 11, 15 and 18. The cross-section A-A' in FIG. 25 corresponds to the cross-sectional planes shown in FIGS. 11, 15 and 18. FIG. 26 illustrates a fragmentary top view of the workpiece 200 shown in FIG. 24. The cross-section B-B' in FIG. 26 corresponds to the cross-sectional planes shown in FIG. 24. Compared to the top view shown in FIG. 25, one of the gate structures 234 in FIG. 26 is replaced with the isolation gate structure 240.

Referring to FIG. 1, method 100 includes a block 130 where further processes are performed. Such further processes may include, for example, deposition of a capping layer, deposition of other ILD layers, formation of source/drain contacts, formation of gate contacts, and formation of further interconnect structures.

Embodiments of the present disclosure may provide means to form MBC transistors of different threshold voltages. Reference is now made to FIGS. 11 and 15. With respect to the gate structure 234, the short inter-member portion 238S of the first gate electrode 238 is narrower than the inter-member portion 238L of the second gate electrode 238' along the X direction. In terms of gate length, the short inter-member portion 238S of the first gate electrode 238 provides a shorter gate length than the inter-member portion 238L of the second gate electrode 238'. The shortened gate length of the short inter-member portion 238S may reduce the threshold voltage for low threshold voltage or high-speed application. It follows that the first inner spacer features 228-1 and the second inner spacer features 228-2 may be implemented in different device regions to provide devices of different threshold voltages even when the same work function metal layers are implemented in the gate structure.

Although not intended to be limiting, one or more embodiments of the present disclosure provide many benefits to a semiconductor device and the formation thereof. For example, embodiments of the present disclosure provide inner spacer features that interpose between vertically stacked channel members. The inner spacer features have a convex shape or a C shape when viewed along the length of the gate structure and the gate dielectric layer is allowed to extend between the convex inner spacer feature and a connection portion of the channel member. This structural arrangement reduces gate-drain and gate-source capacitance and increases effective gate lengths. In some implementations, the inner spacer features of the present disclosure may extend under a topmost portion of the gate electrode to further reduce gate-drain or gate-source capacitance.

In one exemplary aspect, the present disclosure is directed to a semiconductor device. The semiconductor device includes a first channel member having a first channel portion and a first connection portion, a second channel member having a second channel portion and a second connection portion, a gate structure disposed around the first channel portion and the second channel portion, the gate structure including a gate dielectric layer and a gate electrode, and an inner spacer feature disposed between the first connection portion and the second connection portion. The gate dielectric layer extends partially between the inner spacer feature and the first connection portion and between the inner spacer feature and the second connection portion. The gate electrode is absent from between the inner spacer feature and the first connection portion and between the inner spacer feature and the second connection portion.

In some embodiments, a thickness of the first channel portion is substantially equal to a thickness of the first connection portion. In some implementations, the semiconductor device may further include a source/drain feature and the first connection portion and the second connection portion are coupled to the source/drain feature. In some instances, the inner spacer feature includes a first inner spacer layer adjacent the gate dielectric layer and a second inner spacer layer adjacent the source/drain feature. A dielectric constant of the first inner spacer layer is greater than a dielectric constant of the second inner spacer layer. In some embodiments, the first channel member and the second channel member extend lengthwise along a first direction. The second channel member is disposed over the first channel member, the gate electrode includes a topmost portion disposed over the second channel portion and an inter-member portion disposed between the first channel portion and the second channel portion, and a length of the topmost portion along the first direction is greater than a length of the inter-member portion along the first direction. In some embodiments, the semiconductor device may further include a gate spacer layer disposed along a sidewall of the topmost portion. The second connection portion is disposed between the inner spacer feature and the gate spacer layer and a width of the gate spacer layer along the first direction is smaller than a width of the inner spacer feature along the first direction. In some instances, the gate structure extends lengthwise along a second direction perpendicular to the first direction and, when viewed along the second direction, the inner spacer feature includes a C-shape. In some implementations, the gate structure extends lengthwise along a second direction perpendicular to the first direction and, when viewed along the second direction, the inner spacer feature extends below the topmost portion of the gate electrode.

In another exemplary aspect, the present disclosure is directed to a structure. The structure includes a gate structure extending lengthwise along a first direction, an isolation gate structure extending parallel to the gate structure, a source/drain feature disposed between the gate structure and the isolation gate structure along a second direction perpendicular to the first direction, and a plurality of first semiconductor features sandwiched between the isolation gate structure and the source/drain feature along the second direction, the plurality of first semiconductor features being stacked one over another along a third direction perpendicular to the first direction and the second direction. The plurality of first semiconductor features are interleaved by a plurality of inner spacer features.

In some embodiments, when viewed along the first direction, each of the plurality of inner spacer features includes a C-shape. In some implementations, the isolation gate structure is insulative and includes silicon nitride or a metal oxide. In some embodiments, the plurality of inner spacer features include silicon oxide, silicon nitride, silicon oxynitride, silicon oxycarbide, or silicon oxycarbonitride. In some implementations, the structure may further include a spacer layer disposed over a topmost first semiconductor feature of the plurality of first semiconductor features and the spacer layer extends along a sidewall of the isolation gate structure. In some instances, the plurality of first semiconductor features are further interleaved by a plurality of second semiconductor features along the third direction and the plurality of first semiconductor features include silicon and the plurality of second semiconductor features comprise silicon germanium. In some embodiments, each of the plurality of inner spacer features extends into one of the plurality of second semiconductor features along the second direction.

In yet another exemplary aspect, the present disclosure is directed to a semiconductor device. The semiconductor device includes a first source/drain feature and a second source/drain feature, a plurality of channel members stacked vertically and extending between the first source/drain feature and the second source/drain feature along a direction, a plurality of inner spacer features in contact with the first source/drain feature and interleaving the plurality of channel members, and a gate structure disposed over and wrapping around the plurality of channel members. The gate structure includes a gate dielectric layer in contact with the plurality of inner spacer features and a gate electrode spaced apart from the plurality of inner spacer features. The gate dielectric layer partially extends between the plurality of channel members and the plurality of inner spacer features.

In some embodiments, the gate electrode includes a topmost portion above the plurality of channel members and an inter-member portion between two of the plurality of channel members and a width of the topmost portion along the direction is greater than a width of the inter-member portion along the direction. In some implementations, a width of the gate dielectric layer along the direction is greater than the width of the topmost portion along the direction. In some instances, each of the plurality of inner spacer features includes a first inner spacer layer adjacent the gate dielectric layer and a second inner spacer layer adjacent the first source/drain feature and a dielectric constant of the first inner spacer layer is greater than a dielectric constant of the second inner spacer layer. In some embodiments, a nitrogen content of the first inner spacer layer is greater than a nitrogen content of the second inner spacer layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first nanostructure;
a second nanostructure directly over the first nanostructure;
a gate structure wrapping around the first nanostructure and the second nanostructure, the gate structure comprising a gate dielectric layer and a gate electrode;
an inner spacer feature disposed between the first nanostructure and the second nanostructure;
a dielectric isolation gate structure extending parallel to the gate structure;
a third nanostructure and a fourth nanostructure disposed along a sidewall of the dielectric isolation gate structure; and
a silicon germanium feature disposed between the third nanostructure and the fourth nanostructure, wherein the gate dielectric layer extends partially between the inner spacer feature and the first nanostructure and between the inner spacer feature and the second nanostructure, wherein the first nanostructure, the second nanostructure, the third nanostructure, and the fourth nanostructure comprise silicon.

2. The semiconductor structure of claim 1,
wherein the first nanostructure comprises a first channel portion and a first connection portion,
wherein the second nanostructure comprises a second channel portion and a second connection portion,
wherein the inner spacer feature is disposed between the first connection portion and the second connection portion.

3. The semiconductor structure of claim 2, further comprising:
a source/drain feature,
wherein the first connection portion is disposed between the first channel portion and the source/drain feature,
wherein the second connection portion is disposed between the second channel portion and the source/drain feature.

4. The semiconductor structure of claim 3,
wherein the inner spacer feature comprises a first inner spacer layer adjacent the gate dielectric layer and a second inner spacer layer adjacent the source/drain feature,
wherein a dielectric constant of the first inner spacer layer is greater than a dielectric constant of the second inner spacer layer.

5. The semiconductor structure of claim 2,
wherein the first nanostructure and the second nanostructure extend lengthwise along a first direction,
wherein the gate electrode comprises a topmost portion disposed over the second nanostructure and an inter-member portion disposed between the first nanostructure and the second nanostructure,
wherein a length of the topmost portion along the first direction is greater than a length of the inter-member portion along the first direction.

6. The semiconductor structure of claim 5, further comprising:
a gate spacer layer disposed along a sidewall of the topmost portion,
wherein the second connection portion is disposed between the inner spacer feature and the gate spacer layer,
wherein a width of the gate spacer layer along the first direction is smaller than a width of the inner spacer feature along the first direction.

7. The semiconductor structure of claim 5,
wherein the gate structure extends lengthwise along a second direction perpendicular to the first direction,
wherein, when viewed along the second direction, the inner spacer feature includes a C-shape.

8. The semiconductor structure of claim 5,
wherein the gate structure extends lengthwise along a second direction perpendicular to the first direction,
wherein, when viewed along the second direction, the inner spacer feature extends below the topmost portion of the gate electrode.

9. A structure, comprising:
a vertical stack of nanostructures;
a metal gate structure wrapping around each of the vertical stack of nanostructures;
an isolation structure extending parallel to the metal gate structure;
a source/drain feature disposed between the metal gate structure and the isolation structure, the source/drain feature coupled to the vertical stack of nanostructures; and
a plurality of first semiconductor features sandwiched between the isolation structure and the source/drain feature,
wherein the plurality of first semiconductor features are interleaved by a plurality of first inner spacer features and a plurality of silicon germanium features,
wherein the plurality of silicon germanium features are in contact with the isolation structure.

10. The structure of claim 9, further comprising:
a plurality of second semiconductor features, wherein a portion of the plurality of second semiconductor features extends between each of the plurality of first inner spacer features and an adjacent one of the plurality of first semiconductor features.

11. The structure of claim 10, wherein a composition of the plurality of first semiconductor features is different from a composition of the plurality of second semiconductor features.

12. The structure of claim 10,
wherein the plurality of first semiconductor features comprise silicon,
wherein the plurality of second semiconductor features comprise silicon germanium.

13. The structure of claim 9, wherein the isolation structure is insulative and comprises silicon nitride or a metal oxide.

14. The structure of claim 9, wherein the plurality of first inner spacer features comprise silicon oxide, silicon nitride, silicon oxynitride, silicon oxycarbide, or silicon oxycarbonitride.

15. The structure of claim 9, further comprising:
a plurality of second inner spacer features interleaving the vertical stack of nano structures,
wherein the metal gate structure comprises a gate dielectric layer and a gate electrode,
wherein the gate dielectric layer extends partially between one of the plurality of second inner spacer features and an adjacent one of the vertical stack of nanostructures.

16. A semiconductor structure, comprising:
a first source/drain feature and a second source/drain feature;
a first plurality of nanostructures stacked vertically and extending between the first source/drain feature and the second source/drain feature along a direction;
a plurality of inner spacer features in contact with the first source/drain feature and interleaving the first plurality of nanostructures;
a gate structure disposed over and wrapping around each of the first plurality of nanostructures;
a dielectric isolation gate structure disposed adjacent the first source/drain feature;
a second plurality of nanostructures stacked vertically and extending between the first source/drain feature and the dielectric isolation gate structure; and
a plurality of silicon germanium features interleaving the second plurality of nanostructures,
wherein the gate structure comprises a gate dielectric layer in contact with the plurality of inner spacer features and a gate electrode spaced apart from the plurality of inner spacer features, wherein the gate electrode comprises a topmost portion above the plurality of nanostructures and an inter-member portion between two of the plurality of nano structures, wherein the plurality of inner spacer features extend under the topmost portion.

17. The semiconductor structure of claim 16, wherein a width of the topmost portion along the direction is greater than a width of the inter-member portion along the direction.

18. The semiconductor structure of claim 16, wherein the gate dielectric layer partially extends between the first plurality of nanostructures and the plurality of inner spacer features.

19. The semiconductor structure of claim 17, wherein a width of the gate dielectric layer along the direction is greater than the width of the topmost portion along the direction.

20. The semiconductor structure of claim 16, wherein each of the plurality of inner spacer features comprises a first inner spacer layer adjacent the gate dielectric layer and a second inner spacer layer adjacent the first source/drain feature, wherein a nitrogen content of the first inner spacer layer is greater than a nitrogen content of the second inner spacer layer.

* * * * *